(12) United States Patent
Kulick et al.

(10) Patent No.: US 11,224,126 B2
(45) Date of Patent: Jan. 11, 2022

(54) EDGE INTERCONNECTS FOR USE WITH CIRCUIT BOARDS AND INTEGRATED CIRCUITS

(71) Applicants: INDIANA INTEGRATED CIRCUITS, LLC, South Bend, IN (US); SCIENCE APPLICATIONS INTERNATIONAL CORPORATION, Reston, VA (US)

(72) Inventors: Jason M. Kulick, South Bend, IN (US); Tian Lu, Osceola, IN (US); Carlos J. Ortega, Goshen, IN (US); Robert Joseph Engelhardt, Jr., Broomfield, CO (US); John Philip Timler, River Ridge, LA (US)

(73) Assignees: Indiana Integrated Circuits, LLC, South Bend, IN (US); Science Applications International Corporation, Reston, VA (US)

( * ) Notice: Subject to any disclaimer, the term of this patent is extended or adjusted under 35 U.S.C. 154(b) by 0 days.

(21) Appl. No.: 16/757,880

(22) PCT Filed: Jan. 9, 2020

(86) PCT No.: PCT/US2020/012855
§ 371 (c)(1),
(2) Date: Apr. 21, 2020

(87) PCT Pub. No.: WO2020/146578
PCT Pub. Date: Jul. 16, 2020

(65) Prior Publication Data
US 2021/0051799 A1 Feb. 18, 2021

Related U.S. Application Data

(60) Provisional application No. 62/790,713, filed on Jan. 10, 2019.

(51) Int. Cl.
*H05K 1/11* (2006.01)
*H05K 1/03* (2006.01)

(52) U.S. Cl.
CPC .......... *H05K 1/117* (2013.01); *H05K 1/0366* (2013.01); *H05K 1/119* (2013.01); *H05K 2201/032* (2013.01); *H05K 2201/09218* (2013.01)

(58) Field of Classification Search
CPC ............................................... H05K 1/11–119
See application file for complete search history.

(56) References Cited

U.S. PATENT DOCUMENTS

| 5,081,520 | A | 1/1992 | Yoshii et al. |
| 2015/0155090 | A1 | 6/2015 | Burnett et al. |
| 2017/0125389 | A1 | 5/2017 | Kulick et al. |

FOREIGN PATENT DOCUMENTS

WO 2018017659 A1 1/2018

*Primary Examiner* — Jeremy C Norris
(74) *Attorney, Agent, or Firm* — The Webb Law Firm

(57) ABSTRACT

A substrate assembly includes at least one printed circuit (PC) substrate. Each PC substrate includes a PC top surface and a PC bottom surface spaced from each other and an edge that runs at least partially about a periphery of the PC substrate between the PC top surface and the PC bottom surface. The edge includes or defines on a facet or edge surface of the edge at least one projection that extends transverse or normal to the facet or edge surface. The projection includes a projection top surface and a projection bottom surface spaced from each other and the projection can include or be made of conductive material.

15 Claims, 13 Drawing Sheets

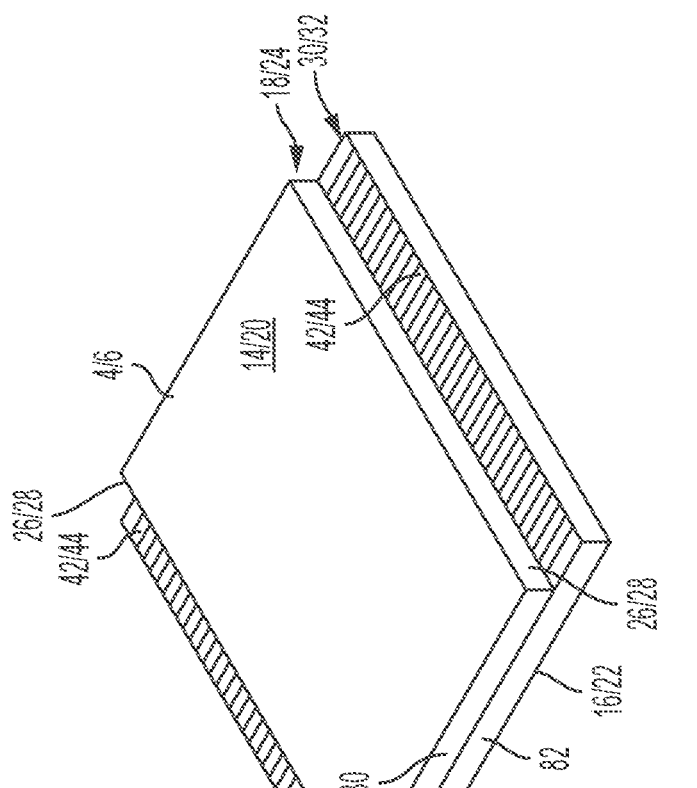
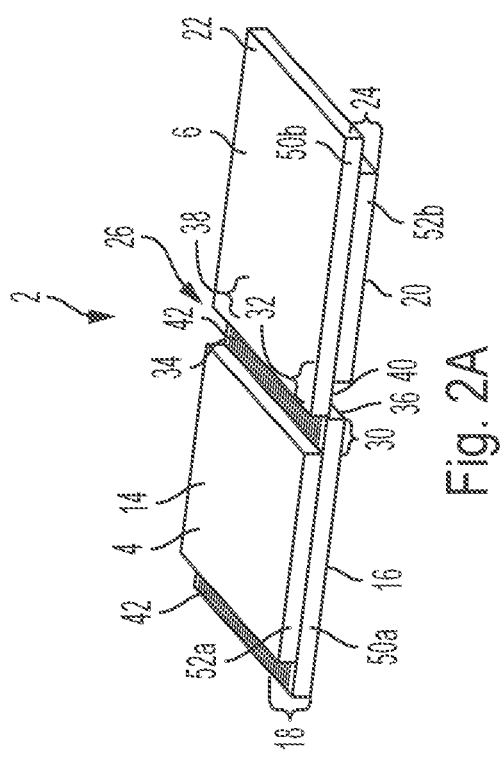
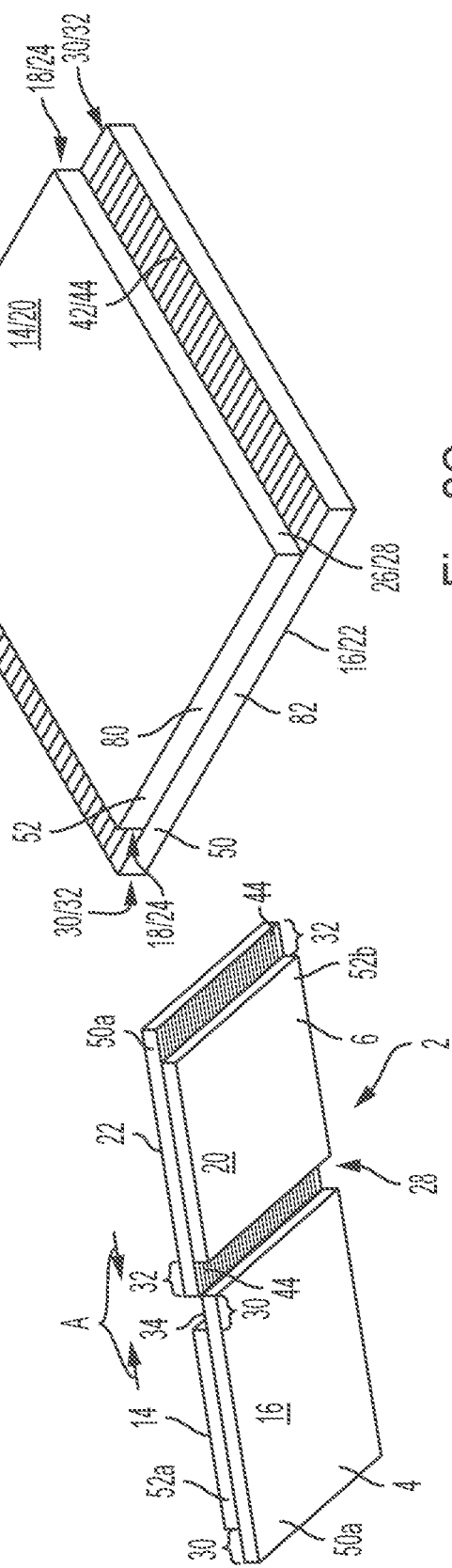

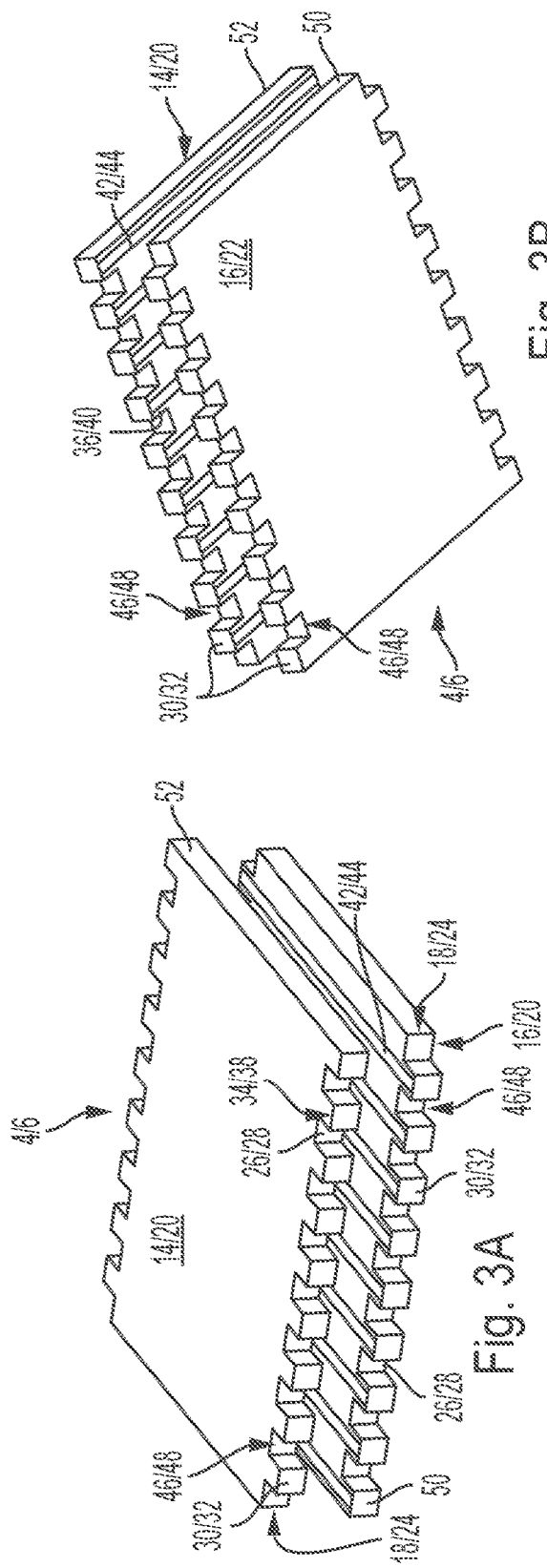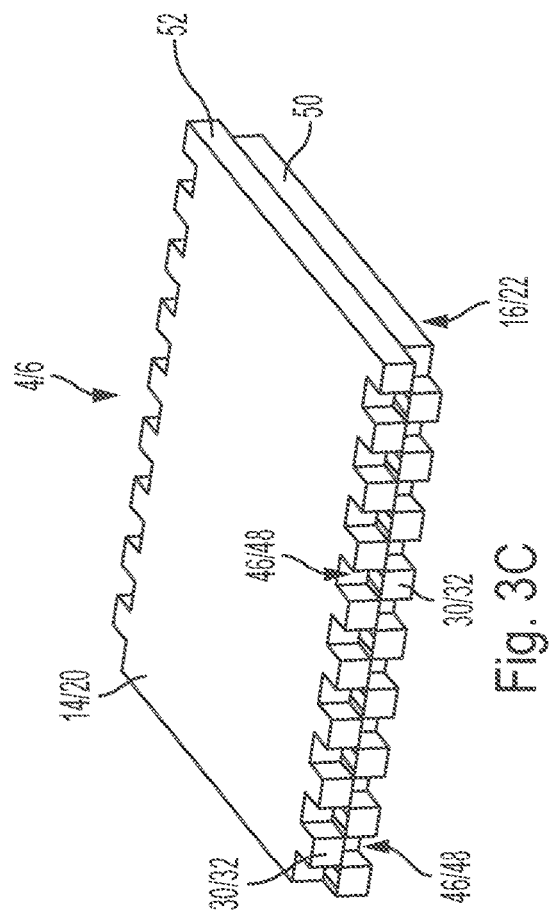

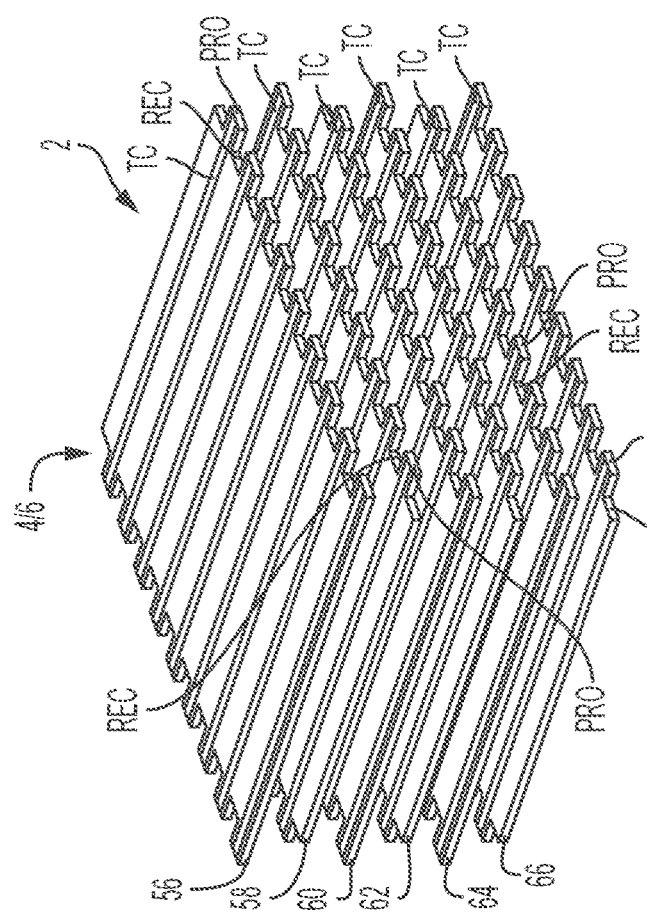
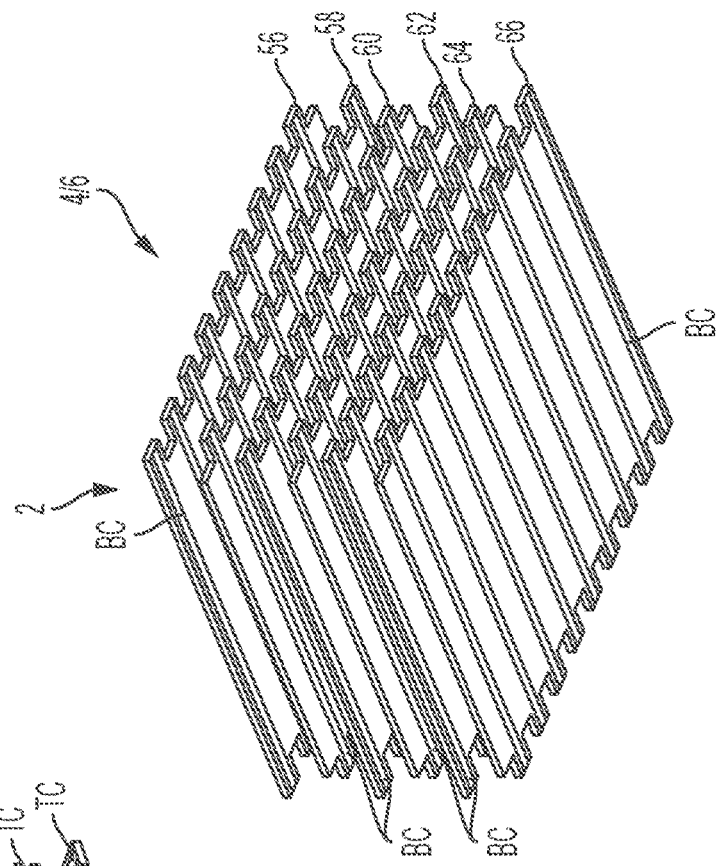

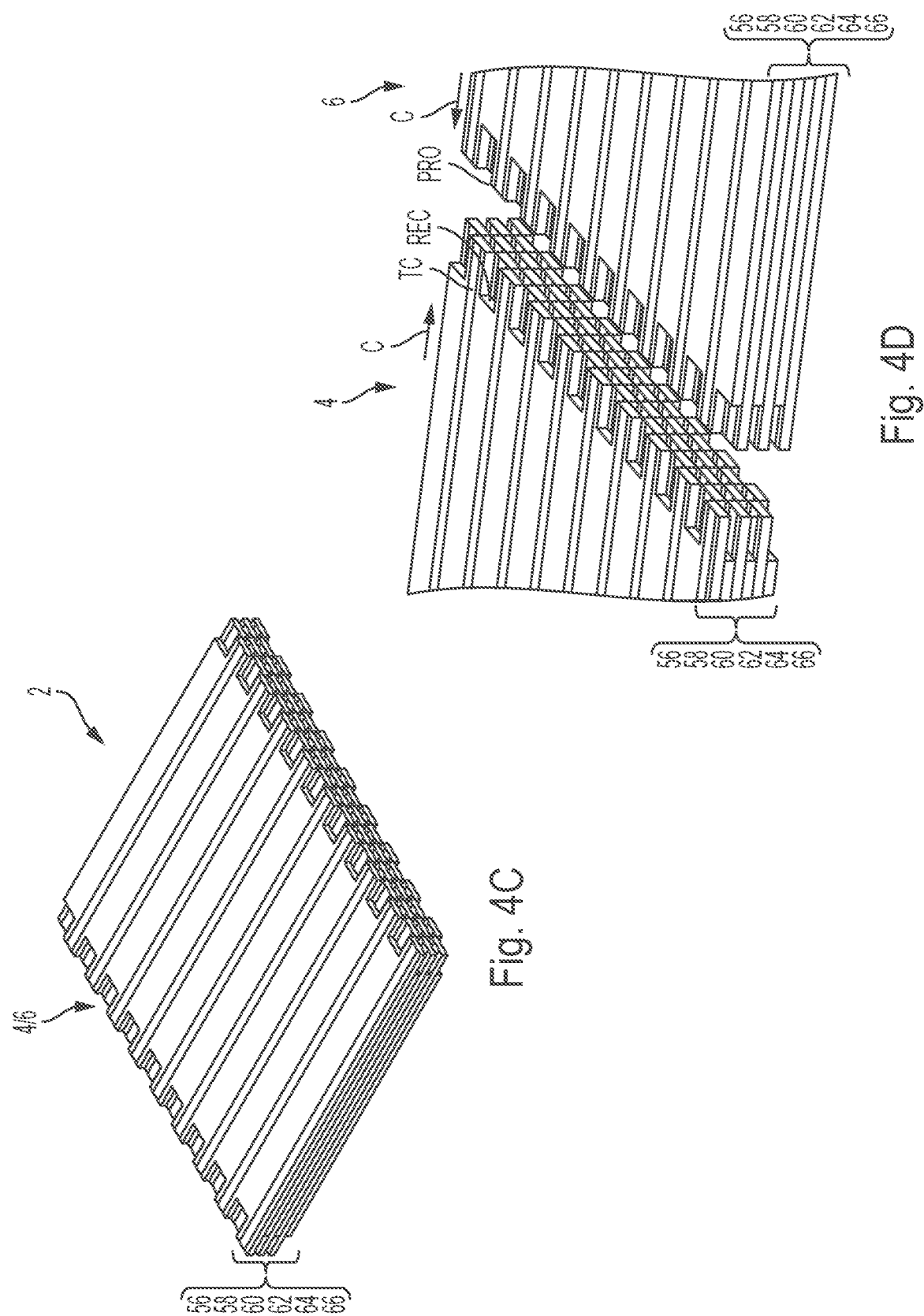

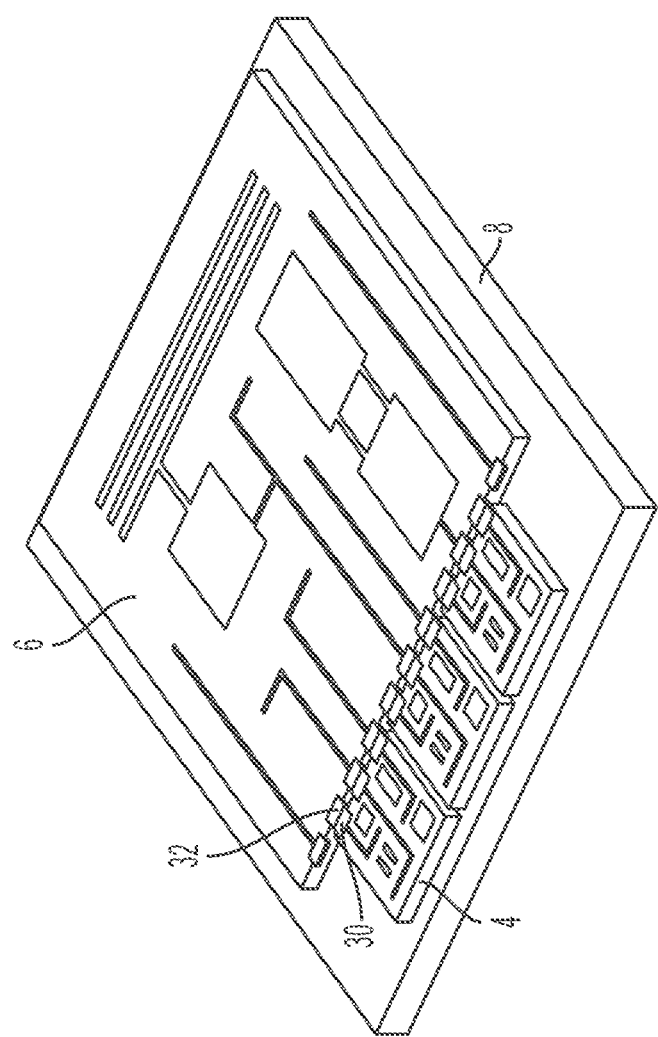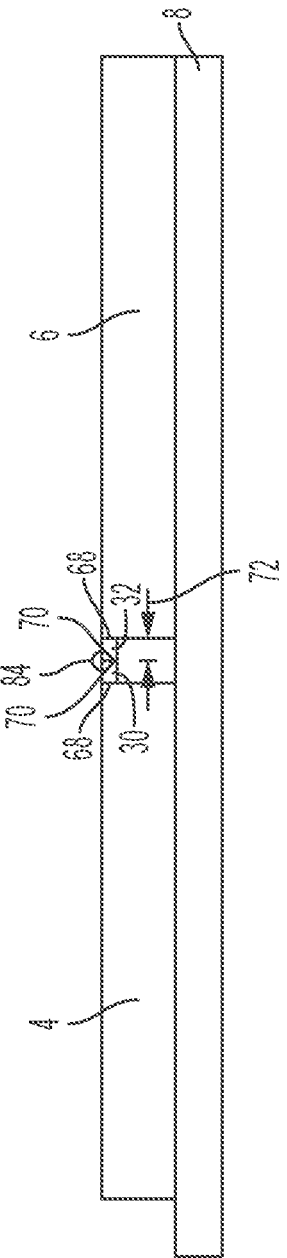
Fig. 6A
Fig. 6B

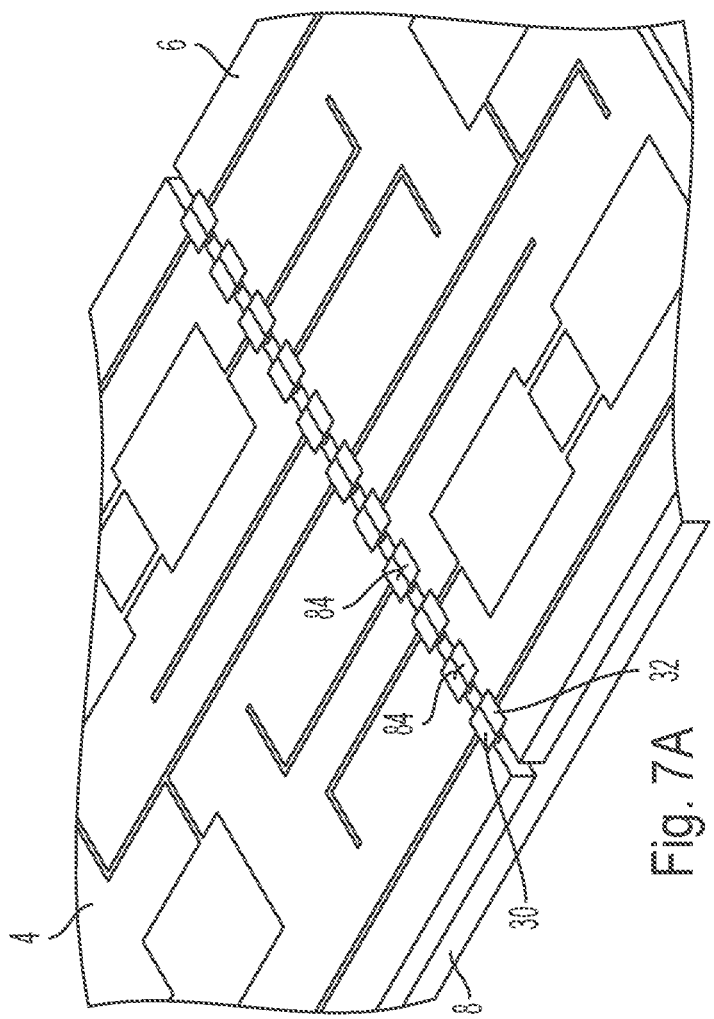
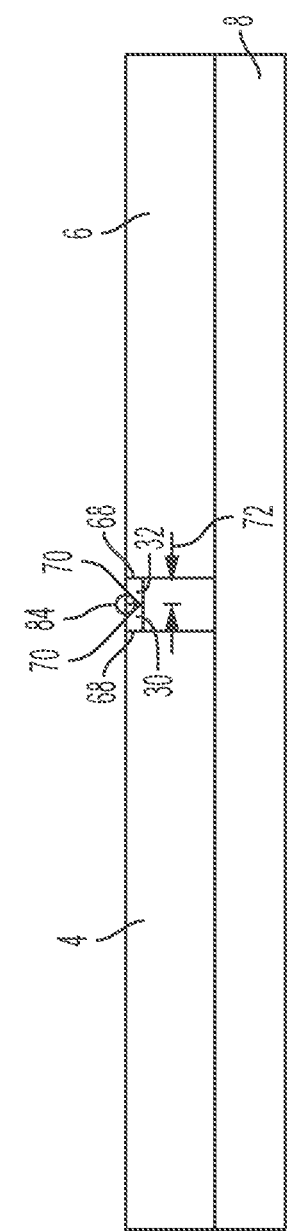

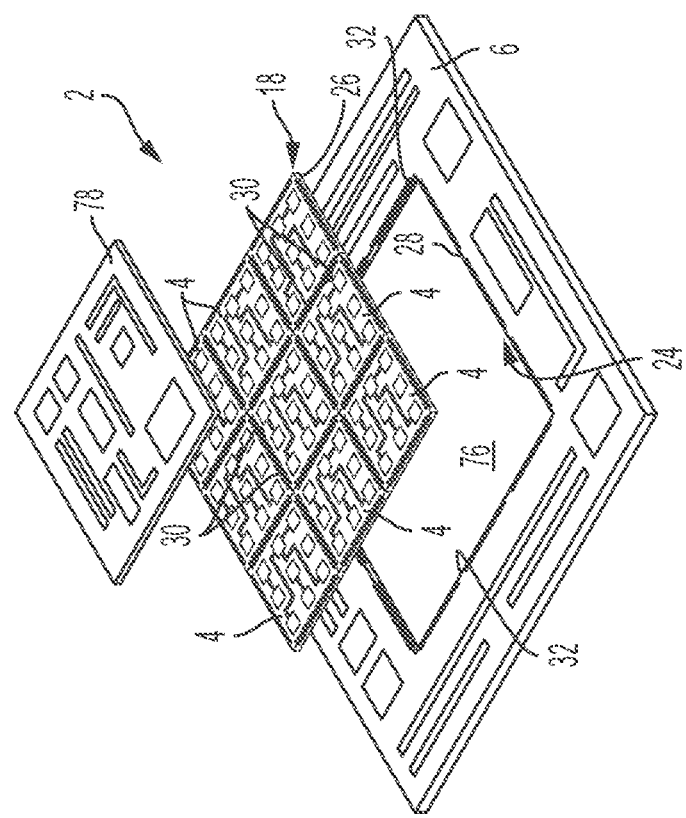
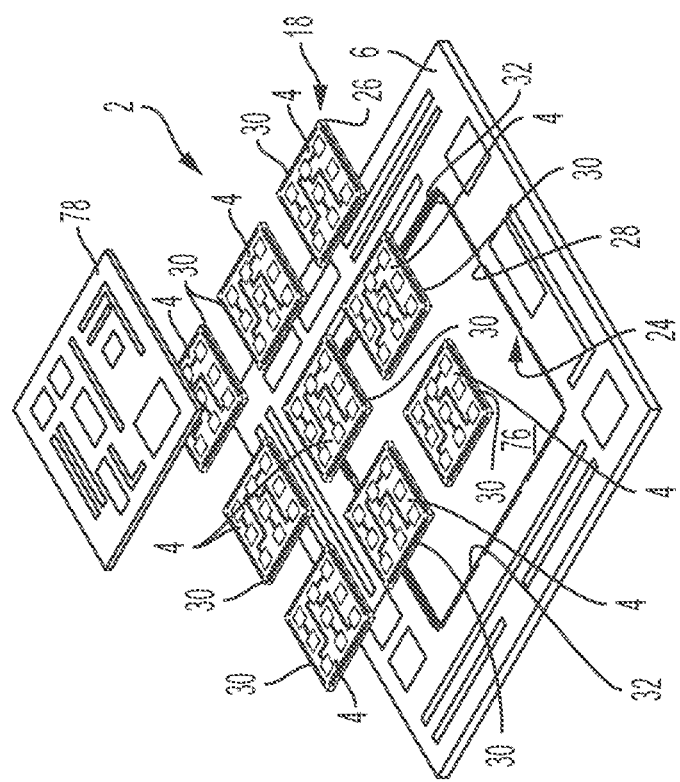

EDGE INTERCONNECTS FOR USE WITH CIRCUIT BOARDS AND INTEGRATED CIRCUITS

CROSS REFERENCE TO RELATED APPLICATIONS

This application is the United States national phase of International Application No. PCT/US2020/012855 filed Jan. 9, 2020, and claims priority to U.S. Provisional Patent Application No. 62/790,713 filed Jan. 10, 2019, the disclosures of which are hereby incorporated by reference in their entirety.

BACKGROUND OF THE INVENTION

Field of the Invention

The present invention relates to electrically interconnecting printed circuit substrates, such as, for example, one or more printed circuit (or wiring) boards, or one or more integrated circuit chips, or some combination of one or more printed circuit (or wiring) boards and one or more integrated circuit chips.

Description of Related Art

Heretofore, interconnecting printed circuit substrates, such as one or more printed circuit (or wiring) boards, or one or more integrated circuit chips, or some combination thereof, to form a substrate assembly was accomplished via one or more mechanical connectors or cables, e.g., ribbon cables, added to the printed circuit substrates and used as a mechanical and/or electrical interface between each pair of printed circuit substrates.

It would, however, be desirable to avoid using mechanical connectors or cables to connect pairs of printed circuit substrates, thereby reducing the physical size of the substrate assembly and/or one or both the printed circuit substrates, reducing the number of steps needed to manufacture the substrate assembly due to not having to mount or couple one or mechanical connectors or cables to each printed circuit substrate, and, possibly, reducing the overall cost of manufacturing the substrate assembly and/or each printed circuit substrate.

SUMMARY OF THE INVENTION

Various preferred and non-limiting examples or aspects of the present invention will now be described and set forth in the following numbered clauses.

Clause 1: A substrate assembly can comprise at least one printed circuit (PC) substrate, wherein: each PC substrate includes a PC top surface and a PC bottom surface spaced from each other and an edge that runs at least partially about a periphery of the PC substrate between the PC top surface and the PC bottom surface. The edge includes or defines on a facet or edge surface of said edge at least one projection that extends transverse or normal to said facet or edge surface. The projection includes a projection top surface and a projection bottom surface spaced from each other. The projection comprises conductive material.

Clause 2: The substrate assembly of clause 1, wherein the conductive material can include a conductor formed on at least one of the projection top surface and the projection bottom surface. The one projection can be formed from the same material as the PC substrate.

Clause 3: The substrate assembly of clause 1 or 2, wherein the projection can be formed of the conductive material. In an example, the projection can be formed entirely of the conductive material which can be adhered to the PC substrate which can be formed, at least partially, of a different, e.g., non-conductive, material.

Clause 4: The substrate assembly of any one of clauses 1-3, wherein at least one of the projection top surface and the projection bottom surface can be coincident, coextensive, or reside in the same plane as the respective PC top surface and the PC bottom surface.

Clause 5: The substrate assembly of any one of clauses 1-4, wherein: one of the projection top surface and the projection bottom surface can be coincident, coextensive, or reside in the same plane as the respective PC top surface and the PC bottom surface; and the other of the projection top surface and the projection bottom surface can extend transverse or normal away from the facet or edge surface from a location between the PC top surface and the PC bottom surface.

Clause 6: The substrate assembly of one of clauses 1-5, wherein the at least one PC substrate can include a first PC substrate and a second PC substrate; the projection of the first PC substrate can include its projection top surface coincident, coextensive, or residing in the same plane as its PC top surface and its projection bottom surface extending transverse from the facet or edge surface of the edge of the first PC substrate from a location between the PC top surface and the PC bottom surface of the first PC substrate. The projection of the second PC substrate can include its projection bottom surface coincident, coextensive, or residing in the same plane as its PC bottom surface and its projection top surface extending transverse from the facet or edge surface of the edge of the second PC substrate from a location between its PC top surface and its PC bottom surface of the second PC substrate. The projection bottom surface of the first PC substrate can overlap and be in contact with the projection top surface of the second PC substrate.

Clause 7: The substrate assembly of one of clauses 1-6, wherein: the projection of the first PC substrate can include its conductive material on its projection bottom surface: and the projection of the second PC substrate can include its conductive material on its projection top surface which makes electrical contact with the conductive material on the projection bottom surface of the projection of the first PC substrate when the projection bottom surface of the first PC substrate overlaps and is in contact with the projection top surface of the second PC substrate.

Clause 8: The substrate assembly of one of clauses 1-7, wherein the at least one projection can include at least one pair of projections having a recess therebetween.

Clause 9: The substrate assembly of one of clauses 1-8, wherein each projection can include the projection top surface and the projection bottom surface coincident, coextensive, or residing in the same planes as the respective PC top surface and the PC bottom surface.

Clause 10: The substrate assembly of one of clauses 1-9, wherein the at least one pair of projections can include: a first pair of spaced projections in a first plane of the PC substrate having a first recess therebetween: and a second pair of spaced projections in a second, parallel plane of the PC substrate having a second recess therebetween, wherein at least one of the first pair of transversely extending projections is aligned, in a direction normal to the first and second planes, with the second recess, and at least one of the second pair of transversely extending projections is aligned, in a direction normal to the first and second planes, with the first recess.

Clause 11: The substrate assembly of one of clauses 1-10, wherein: the at least one PC substrate can include first and second PC substrates, each including the first and second pairs of spaced projections; and the first and second PC substrates can be positioned, arranged, or configured with the first and second pairs of spaced projections of the first PC substrate and the first and second pairs of spaced projections of the second PC substrate interdigitated with each other.

Clause 12: The substrate assembly of one of clauses 1-11, wherein the PC substrate can be comprised of two or more layers.

Clause 13: The substrate assembly of one of clauses 1-12, wherein: the at least one PC substrate can include first and second PC substrates, each including the projection made of the conductive material formed as a cantilevered beam having a proximal end supported by the PC substrate and a free, distal end, wherein a largest dimension of the conductive material formed as the cantilevered beam is a distance between the proximal end and the distal end; and the first and second PC substrates can be positioned, arranged, or configured adjacent or proximate each other with the free, distal ends of their respective projections in electrical contact, wherein one of the first and second PC substrates can be a microchip or a rigid or flexible printed circuit board or printed wiring board and the other of the first and second PC substrates can be a rigid or flexible printed circuit board or printed wiring board. Herein, "cantilevered beam" and "cantilever beam" may be used interchangeably.

Clause 14: The substrate assembly of one of clauses 1-13, wherein the microchip can be formed from a semiconductor material: and each printed circuit board or printed wiring board can be made from at least one of the following: a glass-reinforced epoxy laminate, a polyamide, or PTFE Clause 15 The substrate assembly of one of clauses 1-14, wherein: the at least one PC substrate can include first and second PC substrates, each including the projection of the conductive material and having a proximal end supported by the PC substrate and a free, distal end: and the second PC substrate can be received in a recess in the PC top surface or the PC bottom surface of the first PC substrate with their respective projections in electrical contact.

Clause 16: The substrate assembly of one of clauses 1-15, wherein each projection of the conductive material is formed as a cantilevered beam having the proximal end supported by its PC substrate and the free, distal end, wherein a largest dimension of the conductive material formed as the cantilevered beam can be a distance between the proximal end and the distal end.

Clause 17. The substrate assembly of one of clauses 1-16, wherein each of the first and second PC substrates can be a printed circuit board or printed wiring board.

Clause 18: The substrate assembly of one of clauses 1-17, wherein each printed circuit board or printed wiring board can be made from at least one of the following: a glass-reinforced epoxy laminate, a polyamide, or PTFE.

Clause 19: The substrate assembly of one of clauses 1-18, wherein each projection can include the conductive material formed on the facet or edge surface as a contact pad, wherein a largest dimension of the conductive material formed as the contact pad on the facet or edge surface can be in a direction parallel to the facet or edge surface.

Clause 20: The substrate assembly of one of clauses 1-19, wherein: the at least one PC substrate can include plural second PC substrates received in the recess in the PC top surface or the PC bottom surface of the first PC substrate: and the projections of adjacent or proximate second PC substrates can be in electrical contact.

BRIEF DESCRIPTION OF THE DRAWINGS

These and other features of the present invention will become more apparent from the following description in which reference is made to the appended drawings wherein:

FIGS. 2A-2B are top and bottom exploded perspective views of one non-limiting embodiment or example substrate assembly including two PC substrates, whereupon, when the two PC substrates are assembled, circuitry on the two PC substrates are electrically connected via projections on the ends of the two PC substrates, in accordance with the principles of the present invention;

FIG. 2C is an isolated top perspective view of an example PC substrate that can be used as at least one of the PC substrates shown in FIGS. 2A-2B including a top layer partially overlaying a bottom layer, whereupon ends of the bottom layer including circuitry project out from under the top layer thereby forming projections from the edges of the PC substrate, wherein the top layer and bottom layer may be electrically connected via circuitry on the facing surfaces of the top and bottom layers, in accordance with the principles of the present invention:

FIGS. 3A-3B are top-down and bottom-up exploded perspective views of one non-limiting embodiment or example substrate assembly including a two layer PC substrate, including circuitry on the facing surfaces of each layer, wherein each layer includes at least one castellated edge (sometimes referred to herein as edge castellations) that includes projections from the recessed edge of the layer, in accordance with the principles of the present invention;

FIG. 3C is a top-down perspective view of the two layer PC substrate shown in FIGS. 3A-3B in an assembled state with their respective edge castellations positioned interdigitated, in accordance with the principles of the present invention;

FIGS. 4A-4B are top-down and bottom-up exploded perspective views of one non-limiting embodiment or example substrate assembly including a six layer PC substrate, showing, for example, circuitry on the top and bottom of each layer, wherein each layer includes at least one castellated edge that includes projections from a recessed edge of the layer, in accordance with the principles of the present invention;

FIG. 4C is a top-down perspective view of the six layer PC substrate shown in FIGS. 4A-4B in an assembled state, wherein the circuitry of adjacent or proximate layers facing or in contact with each other may be in electrical contact, wherein the castellated edge of each layer is positioned interdigitated with castellated edges of adjacent or proximate layer(s), in accordance with the principles of the present invention;

FIG. 4D is a top perspective view of two of the assembled PC substrates shown in FIG. 4C positioned with their castellated edges facing each other in spaced relation in preparation for assembly in an interlocking manner, whereupon circuitry on the two assembled PC substrates are electrically connected via conductors on the interlocked castellated edges, in accordance with the principles of the present invention;

FIGS. 6A-6B are top perspective and side views of one non-limiting embodiment or example substrate assembly including a PC substrate and microchip(s) electrically connected to each other by projections formed of conductive material on the PC substrate and the microchip(s), whereupon circuitry on the PC substrate and the microchip(s) are electrically connected via the projections, in accordance with the principles of the present invention:

FIGS. 7A-7B are top perspective and side views of one non-limiting embodiment or example substrate assembly including first and second PC substrates electrically connected to each other by projections of conductive material formed on the first and second PC substrates, whereupon circuitry on the first and second PC substrates are electrically connected, in accordance with the principles of the present invention;

FIG. 9A is an exploded perspective view of one non-limiting embodiment or example substrate assembly including a large PC substrate including a recess or pocket, and a plurality of small PC substrates positioned above the recess or pocket, and another PC substrate positioned above at least a portion of the small PC substrates, in accordance with the principles of the present invention;

FIG. 9B is a perspective view of the substrate assembly of FIG. 9A in a partially assembled state, wherein the plurality of small PC substrates to be received or inserted in the recess or pocket of the large PC substrate are assembled with adjacent or proximate small PC substrates including edge projections of conductive material that electrically connect with each other and thereby to circuitry on adjacent or proximate small PC substrates, the recess or pocket of the large PC substrate including edge projections of conductive material that electrically connect with edge projections of conductive material of small PC substrates positioned at the periphery of the recess or pocket when the assembled small PC substrates are positioned or received in the recess or pocket, and the microchip positioned above at least a portion of the assembled small PC substrates for assembly thereto, e.g., via bump bonding, to contacts on top surfaces of the at least a portion of the small PC substrates, in accordance with the principles of the present invention;

DESCRIPTION OF THE INVENTION

Figure 1A:
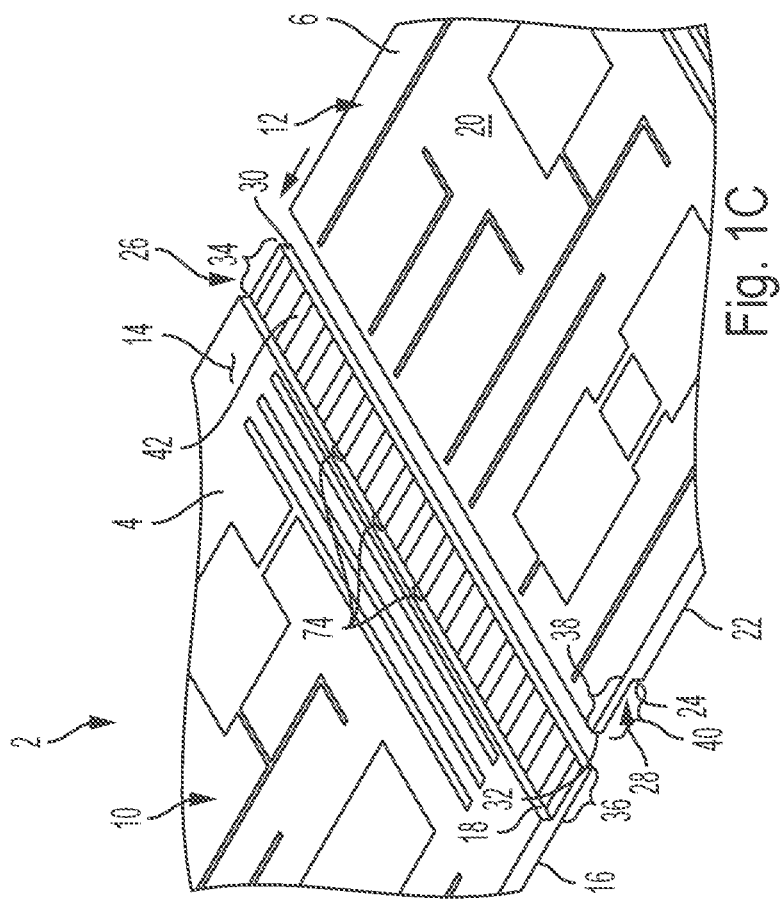
FIGS. 1A-1C are top assembled, side assembled, and exploded perspective views of one non-limiting embodiment or example substrate assembly including two printed circuit (PC) substrates that are electrically connected, whereupon circuitry on the two PC substrates are electrically connected via projections on the edges of the two PC substrates, in accordance with the principles of the present invention.

For the purposes of the following detailed description, it is to be understood that the invention may assume various alternative variations and step sequences, except where expressly specified to the contrary. It is also to be understood that the specific devices and methods described in the following specification are simply exemplary embodiments, examples, or aspects of the invention. Moreover, other than in any operating examples, or where otherwise indicated, all numbers expressing, in preferred and non-limiting embodiments, examples, or aspects, quantities of ingredients used in the specification and claims are to be understood as being modified in all instances by the term "about". Accordingly, unless indicated to the contrary, any numerical parameters set forth in the following specification and attached claims are approximations that may vary depending upon the desired properties to be obtained by the present invention. At the very least, and not as an attempt to limit the application of the Doctrine of Equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

It is also to be understood that the specific devices and processes illustrated in the attached drawings, and described in the following specification, are simply exemplary embodiments, examples, or aspects of the invention. Hence, specific dimensions and other physical characteristics related to the embodiments, examples, or aspects disclosed herein are not to be considered as limiting. Certain preferred and non-limiting embodiments, examples, or aspects of the present invention will be described with reference to the accompanying figures where like reference numbers correspond to like or functionally equivalent elements. In this application, the use of the singular includes the plural and plural encompasses singular, unless specifically stated otherwise. In addition, in this application, the use of "or" means "and/or" unless specifically stated otherwise, even though "and/or" may be explicitly used in certain instances. Further, in this application, the use of "a" or "an" means "at least one" unless specifically stated otherwise.

For purposes of the description hereinafter, the terms "end," "upper," "lower," "right," "left," "vertical," "horizontal," "top," "bottom," "lateral," "longitudinal," and derivatives thereof shall relate to the example(s) as oriented in the drawing figures. However, it is to be understood that the example(s) may assume various alternative variations and step sequences, except where expressly specified to the contrary. It is also to be understood that the specific example (s) illustrated in the attached drawings, and described in the following specification, are simply exemplary examples or aspects of the invention. Hence, the specific examples or aspects disclosed herein are not to be construed as limiting.

Figure 1B:
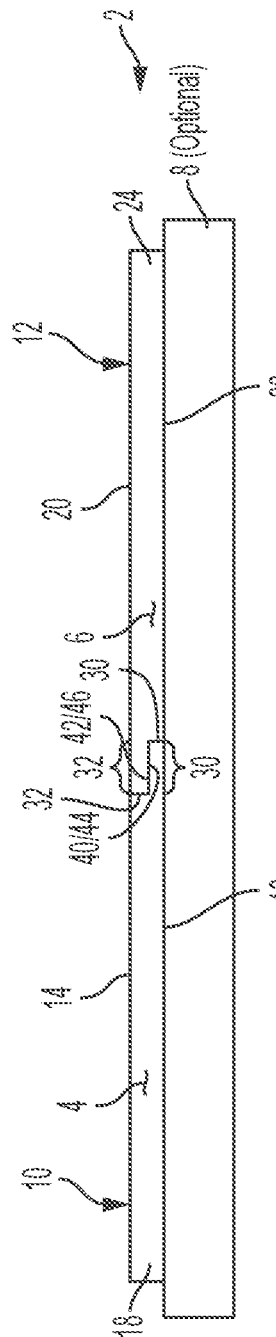
Figure 1C:
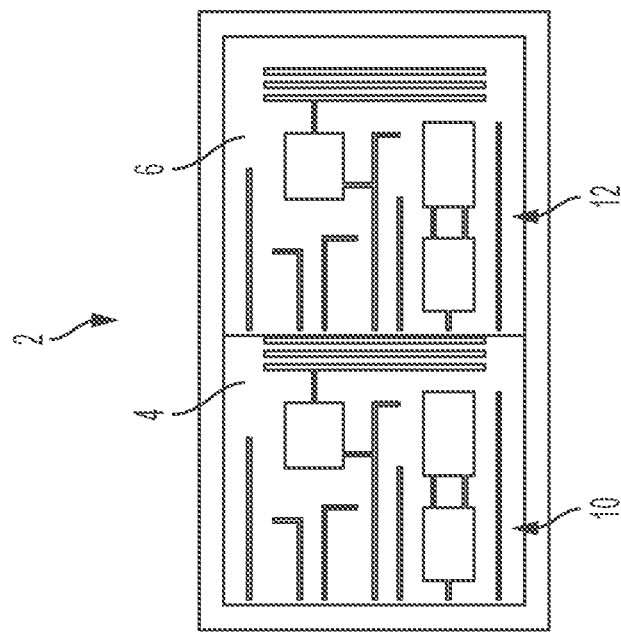

With reference to FIGS. 1A-1C, in some non-limiting embodiments or examples, a substrate assembly 2 can include a single printed circuit (PC) substrate 4 or 6 (see also, for example. FIGS. 2C, 3A-3C, 4A-4C, and 5A-5C). In other non-limiting embodiments or examples, substrate assembly 2 can include two PC substrates 4 and 6 configured to mate, interlock, and/or be electrically connected together, as shown, for example, in FIGS. 1A-1C, 2A-2B, and 3D-3E; 4C-4D; 5D-5E; 6A-6B; 7A-7B; 8A-8B and 9A-9C. In still other non-limiting embodiments or examples, substrate assembly 2 can include three or more PC substrates configured to mate, interlock, and/or be electrically connected to each other, as shown, for example, in FIGS. 6A-6B; 8A-8B; and 9A-9C.

As shown in FIGS. 1A-1C, in some non-limiting embodiments or examples, substrate assembly 2 can include PC substrate 4 having a PC top surface 14 and a PC bottom surface 16 spaced from each other, e.g., in spaced parallel or substantially spaced parallel relation, and an edge 18 that runs or extends at least partially around the periphery of the PC substrate 4 between the PC top surface 14 and the PC bottom surface 16. In some non-limiting embodiments or examples, at least a portion of edge 18 can include or define on a facet or edge surface 26 thereof at least one projection 30 that extends transverse or normal to said facet or edge surface 26 and/or parallel to a plane of the PC top surface 14 or the PC bottom surface 16. In some non-limiting embodiments or examples, the projection 30 can include a projection top surface 34 and a projection bottom surface 36 spaced from each other and the projection 30 can comprise conductive material 42.

Similarly, in some non-limiting embodiments or examples, substrate assembly 2 can include can also include PC substrate 6 having a PC top surface 20 and a PC bottom surface 22 spaced from each other, e.g., in spaced parallel or substantially spaced parallel relation, and an edge 24 that runs or extend at least partially around a periphery of the PC substrate 6 between PC top surface 20 and PC bottom surface 22. In some non-limiting embodiments or examples, at least a portion of edge 24 can include or define on a facet or edge surface 28 thereof at least one projection 32 that extends transverse or normal to said facet or edge surface 28 and/or parallel to a plane of the PC top surface 14 or the PC bottom surface 16. In some non-limiting embodiments or examples, the projection 32 can include a projection top surface 38 and a projection bottom surface 40 spaced from each other and the projection can comprise conductive material 44.

In some non-limiting embodiments or examples, the projections 30 and 32 shown in FIGS. 1A-1C can each include one or more segments, portions, or traces of conductive material 42 and 44, respectively as may be suitable and/or desirable for an application. Each trace of conductive material 42 and 44 can connect to other circuitry on the corresponding PC substrate as may be deemed suitable and/or desirable for the application. Circuitry included on each PC substrate described herein may include, without limitation, one or more of the following: one or more other conductive traces, one or more contact pads, one or more integrated circuits, one or more passive devices, such as resistors, capacitors, inductors, and the like, etc. This list of possible circuitry included on each PC substrate described herein, however, is not to be construed in a limiting sense.

For the purpose of description and illustration only, it may be assumed that each PC substrate described herein includes circuitry, regardless if such circuitry is illustrated or not, and that at least a portion of said circuitry is electrically connected to the conductive material on one or more of the projections described herein.

In some non-limiting embodiments or examples, the illustration in FIG. 1C of the traces of conductive material 42 at the intersection of edge 18, for example, is not to be construed in a limiting sense since it is envisioned that one or more traces of conductive material 42 can connect with circuitry on PC substrate 4 in any suitable or desirable manner. In an example, the one or more traces of conductive material 42 may extend at least partially into the body of PC substrate 4 to connected to circuitry of PC substrate 4 comprised of two or more PC layers. In an example, the one or more traces of conductive material 42 can be formed, in a manner known in the art, on the surface of at least one PC layer, which surface can be coupled to a surface of the other PC layer to form PC substrate 4, i.e., at least a portion of the one or more traces of conductive material 42 may be "buried" between the two or more PC layers. Similar comments apply in respect of PC substrate 6 which may also include one or more traces of conductive material that may extend at least partially into the body of PC substrate 6, for example, between the two or more PC layers, to connected to circuitry of PC substrate 6 comprised of said two or more PC layers.

In some non-limiting embodiments or examples, one or more of traces of conductive material 42 of projection 30 may connect to circuitry of PC substrate 4 on PC top surface 14 via a corresponding vertical conductor 74 formed on edge 18. The particular manner by which one or more traces the conductive material 42 may be coupled to circuitry of PC substrate 6 can include buried trace(s), vertical conductor(s) 74, or some combination of buried trace(s) and vertical conductor(s) 74 and is, therefore, not to be construed in a limiting sense. Similarly, one or more traces of conductive material 44 of projection 32 may connect to circuitry of PC substrate 6 on PC top surface 20 via buried trace(s) between the two or more PC layers comprising PC substrate 6, vertical conductor(s) (not specifically shown) formed on edge 24, or some combination of buried trace(s) and vertical conductor(s).

In some non-limiting embodiments or examples, as shown in FIGS. 1B and 1C, at least one of the projection top surface 34 and the projection bottom surface 36 of PC substrate 4 can be coincident, coextensive, or reside in the same plane as the respective PC top surface 14 and the PC bottom surface 16 of PC substrate 4. Similarly, at least one of the projection top surface 38 and the projection bottom surface 40 of PC substrate 6 can be coincident, coextensive, or reside in the same plane as the respective PC top surface 20 and the PC bottom surface 22 of PC substrate 6. In an example (FIGS. 1A-1C), PC bottom surface 16 of PC substrate 4 is coincident, coextensive, or resides in the same plane as projection bottom surface 36 of projection 30 and projection top surface 38 of projection 32 is coincident, coextensive, or resides in the same plane as PC top surface 20 of PC substrate 6. However, this is not to be construed in a limiting sense.

In some non-limiting embodiments or examples, projection top surface 34 of projection 30 of PC substrate 4 extends transverse or normal away from the facet or edge surface 26 of edge 18 of PC substrate 4 from a location between or intermediate PC top surface 14 and PC bottom surface 16. Similarly, in some non-limiting embodiments or examples, projection bottom surface 40 of projection 32 of PC substrate 6 extends transverse or normal away from the facet or edge surface 28 of edge 24 of PC substrate 6 between or intermediate PC top surface 20 and PC bottom surface 22.

As shown in FIG. 1B, the projection bottom surface 40 of PC substrate 6 can overlap and contact (directly or indirectly via an interposer, e.g., an adhesive) the projection top surface 34 of PC substrate 4, whereupon one or more traces of conductive materials 42 and 44 on projections 30 and 32 can be in electrical contact such that electrical power and/or electrical signals can be provided from PC substrate 4 to PC substrate 6, or vice versa.

Herein, "in electrical contact" may include direct (touching) or indirect electrical contact. Indirect electrical contact may be via an interposer. Non-limiting examples of an interposer may include, without limitation, solder, or a conductive material, e.g., a conductive adhesive. In another example, indirect electrical contact may be via capacitive coupling and a non-electrically conductive material, e.g., a non-conductive adhesive and capacitive coupling. However, the foregoing is not to be construed in a limiting sense.

In some non-limiting embodiments or examples, the projection bottom surface 40 of PC substrate 6 can be held overlapping and in contact with the projection top surface 34 of PC substrate 4 via mechanical means (not shown) and/or via solder between vertically aligned traces of conductive materials 42 and 44, and/or via a conductive adhesive that conducts vertically, or substantially vertically, between vertically aligned traces of conductive materials 42 and 44. However, this is not to be construed in a limiting sense.

In some non-limiting embodiments or examples, when viewed from the sides thereof, each projection 30 and 32 and the underlying PC substrate 4 and 6 can have the form of "L", i.e., an L-shape. In some non-limiting embodiments or examples, when the projection bottom surface 40 of PC substrate 6 overlaps and contacts the projection top surface 34 of PC substrate 4 as shown in FIG. 1B, PC top surfaces 14 and 20 of PC substrates 4 and 6 can be coplanar or substantially coplanar. In some non-limiting embodiments or examples, when the projection bottom surface 40 of PC substrate 6 overlaps and contacts the projection top surface 34 of PC substrate 4 as shown in FIG. 1B. PC bottom surfaces 16 and 2 of PC substrates 4 and 6 can be coplanar or substantially coplanar.

An advantage of having conductive materials 42 and 44 on projections 30 and 32 in electrical contact is that it can avoid the use of mechanical connectors on PC substrates 4 and 6 and/or cables, e.g., a ribbon cable, for mechanically and electrically connecting circuitry on PC substrates 4 and 6. By avoiding the use connectors and cables, PC substrates 4 and 6 may have a lower profile than would be that case when connectors and/or cables are used. Another advantage is ease of assembly and electrically connecting PC substrates 4 and 6 without having to mount connectors and/or cables to PC substrates 4 and 6 and connect PC substrates 4 and 6 via said connectors and/or cables.

With reference to FIGS. 2A-2C and with continuing references to FIGS. 1A-1C, in some non-limiting embodiments or examples, each PC substrate 4, 6 can be a multilayer PC substrate having a top layer 80 at least partially overlaying a bottom layer 82 such that one or more portions of bottom layer 82 are visible or project out or extend from beneath top layer 80 forming one or more projections 30, 32. Electrical connections (not shown) can extend between top layer 80 and bottom layer 82 in a manner known in the art, e.g., by way of electrically conductive vias, when top layer 80 is positioned on top of bottom layer 82 as shown in FIG. 2C.

In some non-limiting embodiments or examples, as shown in FIGS. 2A and 2B, two PC substrates 4 and 6 of the type shown in FIG. 2C can be positioned proximate each other with the traces of conductive material 42 of projection 30 of PC substrate 4 facing upward and with the traces of conductive material 44 of projection 32 of PC substrate 6 facing downward, whereupon moving PC substrate 6 in the directions of arrows A (FIG. 2B) and moving PC top surface 34 of PC substrate 4 and PC bottom surface 40 of PC substrate 6 together into contact results in one or more of traces of conductive materials 42 and 44 coming into contact in a manner similar to traces of conductive materials 42 and 44 shown in FIG. 1C.

In some non-limiting embodiments or examples, other projections 30 and 32 on other edges of PC substrates of 4 and 6 (other than the overlapping projections 30 and 32) can be utilized to electrically connect one or more other PC substrates (not shown) to one or both of PC substrates 4 an 6 in the same manner shown in FIGS. 1A-2C. However, this is not to be construed in the limiting sense since it is envisioned that the non-overlapping projection 30 and 32 of PC substrates 4 and 6 may not be present or, if present, my not overlap or be overlapped by a projection of another PC substrate (not shown).

In some non-limiting embodiments or examples, FIGS. 2A-2C show PC substrates that are multilayer and FIGS. 1A-1C show PC substrates 4 and 6 that may be multilayer or a single layer. In the case where a PC substrate 4 or 6 is a single layer, the corresponding projection 30 or 32 can be formed by the removal of the material forming the corresponding PC substrate and one or more traces conductive materials 42 and 44 can be formed on the corresponding projection and, if provided, one or more traces of vertical conductors 74 can be formed on one or more facets or edge surfaces 26 and 28 of edges 18 and 24.

In the example shown in FIGS. 2A-2B, the projection bottom surface 40 of PC substrate 6 can be held overlapping and in contact with the projection top surface 34 of PC substrate 4, whereupon one or more traces of conductive materials 42 and 44 on projections 30 and 32 can be in electrical contact such that electrical power and/or electrical signals can be provided from PC substrate 4 to PC substrate 6, or vice versa.

In some non-limiting embodiments or examples, when viewed from the sides thereof, each projection 30 and 32 and the underlying PC substrate 4 and 6 can have the form of "L", i.e., an L-shape. In some non-limiting embodiments or examples, when the projection bottom surface 40 of PC substrate 6 overlaps and is in contact the projection top surface 34 of PC substrate 4, PC top and bottom surfaces 14 and 20 of PC substrates 4 and 6 can be coplanar or substantially coplanar. In some non-limiting embodiments or examples, when the projection bottom surface 40 of PC substrate 6 overlaps and is in contact the projection top surface 34 of PC substrate 4, PC bottom and top surfaces 16 and 20 of PC substrates 4 and 6 can be coplanar or substantially coplanar.

The multi-layer PC substrates shown in FIGS. 2A-2C can have one or more of the same advantages discussed above for the PC substrates shown in FIGS. 1A-1C.

Figure 3E:
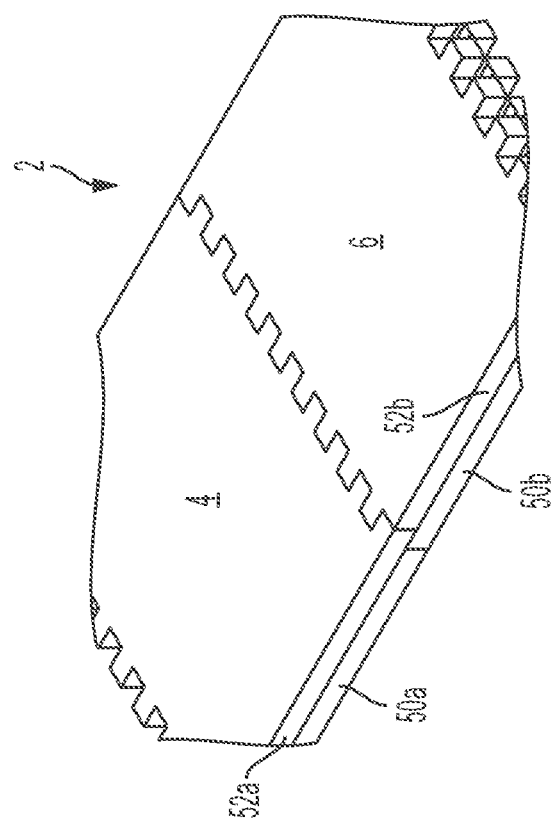
FIG. 3E is a top perspective view of the two PC substrates shown in FIG. 3D coupled together in an assembled state with their respective castellated edges interdigitated and the circuitry on the two PC substrates electrically connected via circuitry on their respective castellated edges, in accordance with the principles of the present invention.

With reference to FIGS. 3A-3E and with continuing reference to all previous figures, in some non-limiting embodiments or examples, the at least one PC substrate 4, 6 can include a first layer 50 and a second layer 52 that can be layered or coupled together with an upper facing surface of layer 50 in contact (directly or indirectly via an interposer) with a bottom facing surface of second layer 52 as shown in FIG. 3C. As shown in FIGS. 3A-3B, the upper facing surface of first layer 50 may include one or more traces of conductive material 42, 44 and the downward facing surface of second layer 52 may include one or more traces of conductive material 42, 44. Depending on the application, the one or more traces of conductive material 42, 44 on the upper facing surface of first layer 50 may or may not be in electrical contact with the one or more traces of the conductive material 42, 44 on the downward facing surface of second layer 52. In an example, first layer 50 may include circuitry (not shown for the purpose of simplicity) that may be electrically connected to the one or more traces of conductive material 42, 44 on first layer 50. In an example, second layer 52 may include circuitry (not shown for the purpose of simplicity) that may be electrically connected to the one or more traces of conductive material 42, 44 on second layer 52.

In some non-limiting embodiments or examples, each layer 50 and 52 can include at least one pair of side-by-side projections 30, 32 having a recess 46, 48 therebetween. In some non-limiting embodiments or examples, each recess 46, 48 can be defined by the facet or edge surface 26, 28 of an edge 18, 24 of the corresponding layer 50, 52. In some non-limiting embodiments or examples, each projection 30, 32 includes at least one of its projection top surface 34, 38 and its projection bottom surface 36, 40 coincident, coextensive, or residing in the same plane as the respective PC top surface 14, 20 or PC bottom surface 16, 22.

In some non-limiting embodiments or examples, each PC substrate 4, 6 can include a first pair of spaced projections 30, 32 in a first plane of the PC substrate defined by first layer 50 having a first recess 46, 48 therebetween. In an example, a second pair of spaced projections 30, 32 can be in a second, parallel plane of the PC substrate defined by second layer 52 having a second recess 46, 48 therebetween. In an example, when the upward facing surface of first layer 50 and the downward facing surface of second layer 52 are moved into contact (directly or indirectly via an interposer) with each other, as shown in FIG. 3C, at least one of the first pair of projections 30, 32 in the first plane defined by first layer 50 can be aligned, in a direction normal to the first and second planes, with a recess 40, 46 between a pair of projections 30, 32 in the second plane defined by second layer 52. Similarly, in some non-limiting embodiments or examples, at least one of the projections 30, 32 in the second plane defined by second layer 52 can be aligned, in a direction normal to the planes of first and second layers 50 and 52, with a recess 40, 46 between a pair of projections 30, 32 in the first plane defined by first layer 50.

In some non-limiting embodiments or examples, as can be seen in FIG. 3A-3C, the projections 30, 32 and recesses 46, 48 between pairs of projections 30, 32 of each layer 50 and 52 form or define castellations. As shown in FIG. 3C, for example, the projections 30, 32 of first layer 50 can be aligned, in a direction normal to the planes of first and second layers 50 and 52, with a recess 40 and 46 of second layer 52. Similarly, projections, 30, 32, of second layer 52 can be aligned, in a direction normal to the planes of first and second layers 50 and 52, with recesses 46, 48 between projections 30, 32 of first layer.

In summary, FIGS. 3A-3C show a two layer PC substrate having overlapping projections and recesses when viewed in a direction normal to the planes of first and second layers. First PC layer 50 may include circuitry (not specifically shown) on its top side while second layer 52 may include circuitry (not specifically shown) on its bottom side. In an example, the traces or contact pads of first and second layers 50 and 52 may be in electrical contact when the first and second layers 50 and 52 are joined together as shown in FIG. 3C. Both the projections and the recesses of each layer 50 and 52 can be of any number, size, and geometry. A recess and an overlapping projection may have different lengths, and/or widths, and/or heights.

Figure 3D:
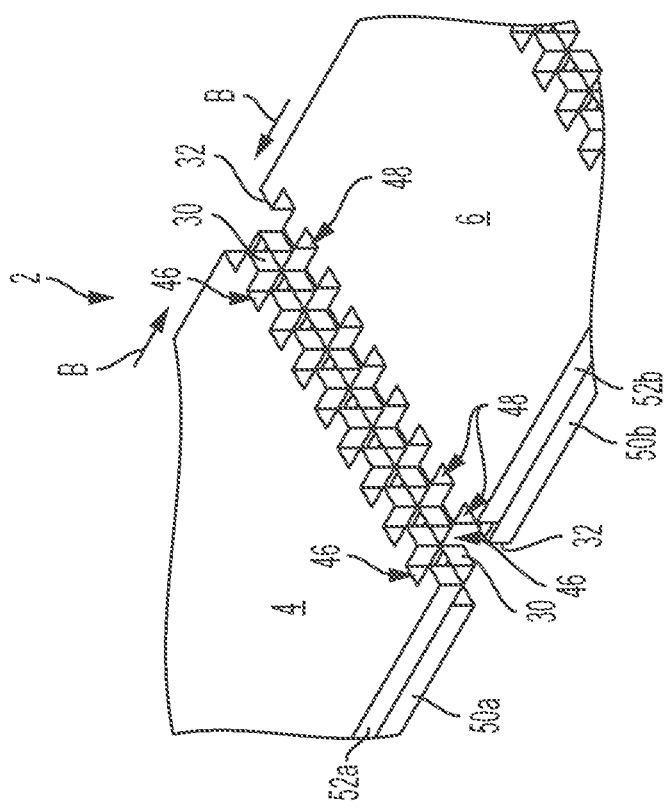
FIG. 3D is a top perspective view of one non-limiting embodiment or example substrate assembly including two of the assembled PC substrates shown in FIG. 3C positioned with their respective castellated edges facing each other in spaced relation in preparation for assembly, in accordance with the principles of the present invention.

With reference to FIGS. 3D-3E and with continuing reference to FIGS. 3A-3C, in some non-limiting embodiment or examples, first and second PC substrates 4 and 6 each having projections and recesses as shown in FIG. 3C, for example, can be positioned with their respective projections and recesses in spaced relation as shown in FIG. 3D. Next, PC substrates 4 and 6 can be moved in the directions of arrows B in FIG. 3C whereupon one or more projections 30 of first PC substrate 4 can be received in one or more recesses 48 of second PC substrate 6 in an interdigitated manner and one or more projections 32 of second PC substrate 6 can be received in one or more recesses 46 of first PC substrate 4 in an interdigitated manner to form substrate assembly 2 as shown in FIG. 3E.

The multi-layer PC substrates shown in FIGS. 3A-3E can have one or more of the same advantages discussed above for the PC substrates shown in FIGS. 1A-1C.

With reference to FIGS. 4A-4D, in some non-limiting embodiments or examples, the substrate assembly shown in FIGS. 3D-3E, comprising a pair of PC substrates 4 and 6, can be extended, as shown in FIGS. 4A-4D, to a substrate assembly 2 comprising a pair of PC substrates 4 and 6 including more than 2 layers, e.g., three four, or more layers. In the non-limiting embodiment or example shown in FIGS. 4A-4D, PC substrates 4 and 6 each include six layers 56, 58, 60, 62, 64, and 66 which can be layered together. Each layer 56-66 can include at least a pair of projections (PRO) having a recess (REC) therebetween.

Herein, each projection may sometimes be referred to by a reference number, e.g., 30, 32, or may sometimes be referred to generically by the phrase "PRO". Similarly, each recess between a pair of projection or to one side of a single projection may sometimes be referred to by a reference number, e.g., 46, 48, or may sometimes be referred to generically by the phrase "REC".

In the example shown in FIGS. 4A-4B, each layer 56-66 includes a number of alternating projections PROs and recesses RECs. In the example shown in FIGS. 4A-4D, each layer 56-66 includes an end recess REC that is not bounded on either side by a projection PRO. However, this is not to be construed in the limiting sense since the number of projections PROs and recesses RECs, the respective lengths, widths, and heights of each projection PRO and recess REC, and the arrangement of projections 6931 PROs and recesses RECs of each layer 56 can be selected in any suitable and/or desirable manner for a particular application.

In some non-limiting embodiments or examples, one or some or all of layers 56-66 may include on the top surface thereof top circuitry (TC). Moreover, also or alternatively, one or some or all of layers 56-66 may include on the bottom surface thereof bottom circuitry (BC). However, this is not to be construed in a limiting sense. In some non-limiting embodiments or examples, when layers 56-66 are layered together as shown in FIG. 4C, TC and BC of proximate layers 56-66 may be in electrical contact with each other or may be in electrical contact with circuitry in other layers by way of one or more electrically conductive vias (not specifically shown).

In some non-limiting embodiments or examples, as shown in FIG. 4D, first and second six-layer PC substrates 4 and 6 can be placed with their respective RECs and PROs in spaced facing relationship. Next, first and second PC substrates positioned as shown in FIG. 4D can be moved in the directions of arrows C whereupon one or more projections PRO of second PC substrate 6 can be received in one or more recesses REC of first PC substrate 4 in an interdigitated manner and one or more projections PRO of first PC substrate 4 may be received in one or more recesses REC of second PC substrate 6 in an interdigitated manner in a manner similar to the projections and recesses of first and second substrates 4 and 6 shown in FIG. 3E.

The multi-layer PC substrates shown in FIGS. 4A-4D can have one or more of the same advantages discussed above for the PC substrates shown in FIGS. 1A-1C.

With reference to FIGS. 5A-5E and with reference back to FIGS. 3A-3E, in some non-limiting embodiments or examples, each layer 50 and 52 of a multilayer PC substrate 4, 6 may include one or more projections PRO having the same or different lengths, e.g., lengths L1 and L2. In some non-limiting embodiments or examples, each layer may have projections PRO having the same or different widths, e.g., widths W1 and W2. In some non-limiting embodiments or examples, each layer may include a recess REC defined on one side by a projection PRO having a length L1, and on the other side by a projection PRO having a length L2. In this latter example, lengths L1 and L2 may be the same or different.

Figure 5B:
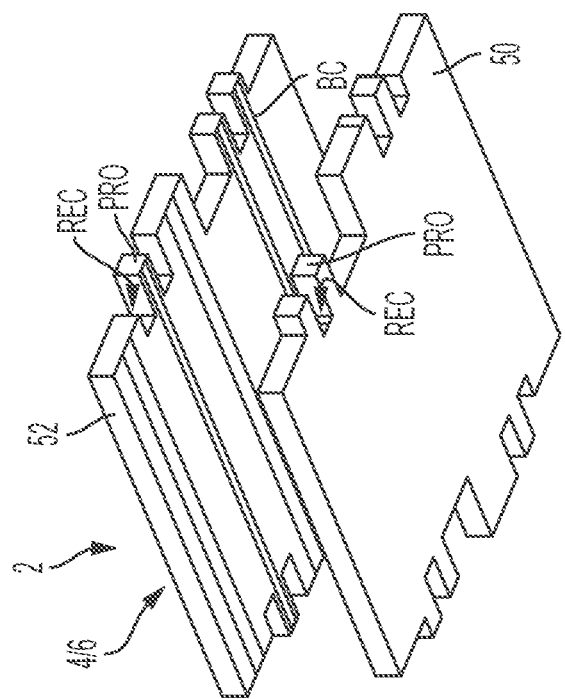
FIGS. 5A-5B are top-down and bottom-up exploded perspective views of one non-limiting embodiment or example substrate assembly including a two layer PC substrate, including circuitry on the facing surfaces of each layer, wherein each layer includes at least one castellated edge that includes projections and recesses, wherein the some of the projections and some of the recesses of said castellated edge have different geometries or dimensions, in accordance with the principles of the present invention.
Figure 5C:
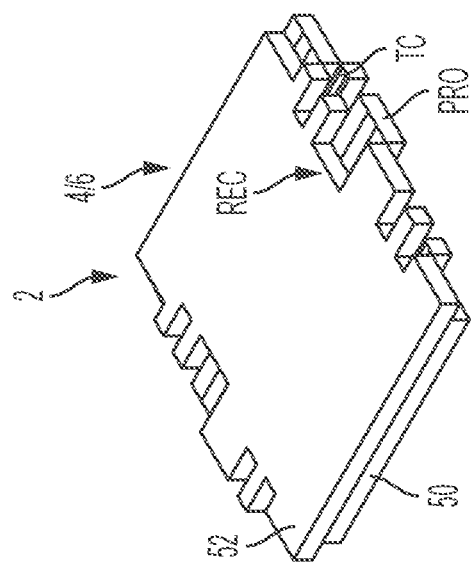
FIG. 5C is a top-down perspective view of the two layer PC substrate shown in FIGS. 5A-5B in an assembled state with their respective edge castellations positioned interdigitated, in accordance with the principles of the present invention.
Figure 5A:
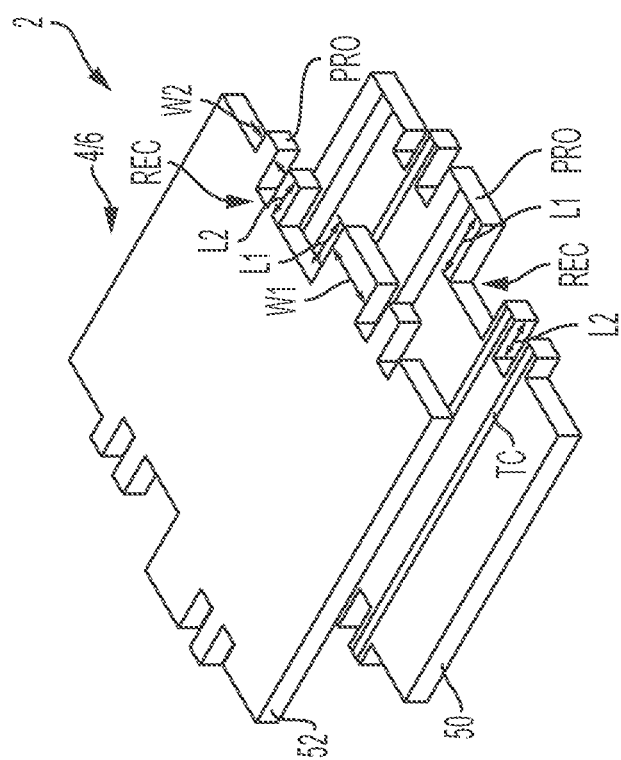

In some non-limiting embodiments or examples, when the layers 50 and 52 of the PC substrate as shown in FIGS. 5A-5B, are layered together as shown in FIG. 5C, layers 50 and 52 of the PC substrate can include at least one projection PRO in one layer aligned with at least one recess REC in the other layer.

Figure 5D:
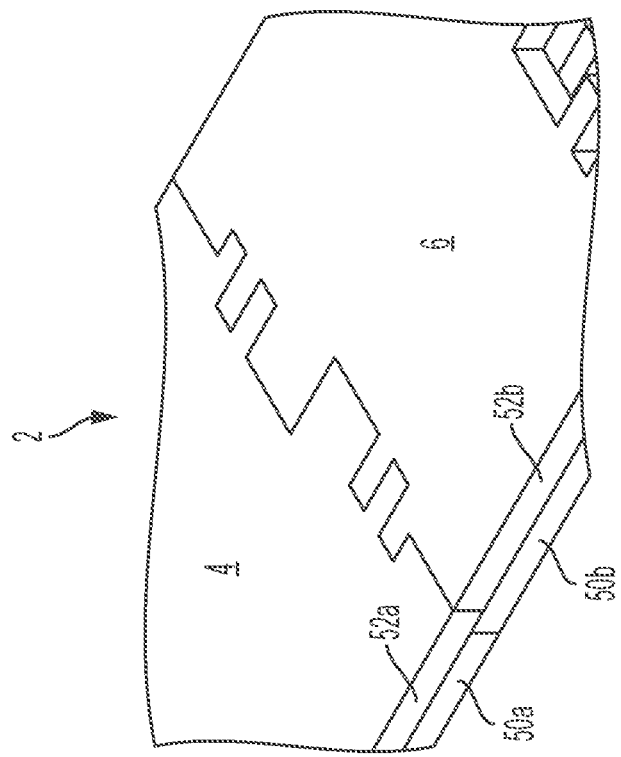
FIG. 5D is a close-up top perspective view of one non-limiting embodiment or example substrate assembly including two of the assembled PC substrates shown in FIG. 5C positioned with their respective castellated edges facing each other in spaced relation in preparation for assembly, in accordance with the principles of the present invention.
Figure 5E:
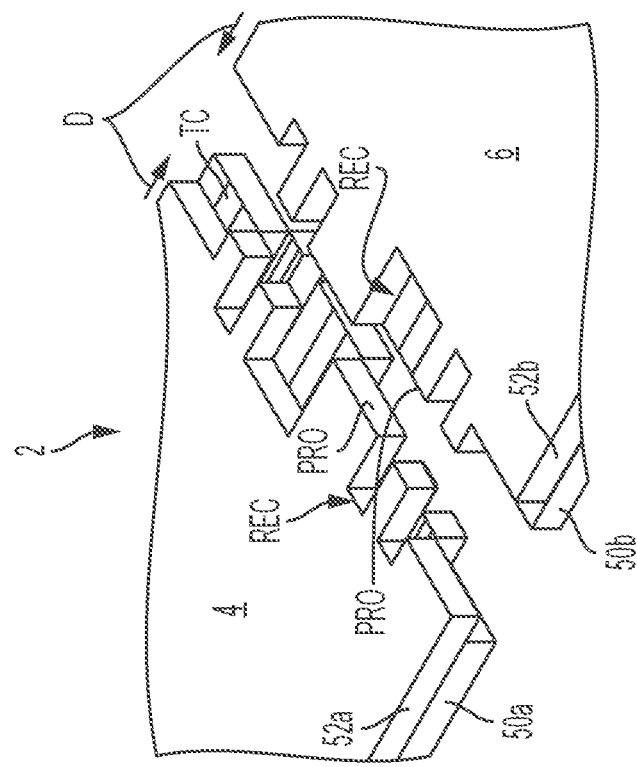
FIG. 5E is a perspective view of the two PC substrates shown in FIG. 5D coupled together in an assembled state with their respective castellated edges interdigitated, whereupon circuitry on the two PC substrates are electrically connected via circuitry on their respective castellated edges, in accordance with the principles of the present invention.

With reference to FIGS. 5D-5E and with continuing reference to FIGS. 5A-5C, in some non-limiting embodiment or examples, first and second PC substrates 4 and 6, each having the form shown in FIG. 5C, can be positioned with their projections PROs and recesses RECs in spaced facing relation as shown in FIG. 5D. In an example, projections PROs and recesses RECs in first PC substrate 4 can be at least partially complimentary to recesses RECs and projections PROs of second PC substrate 6, as shown in FIG. 5D. However, this is not to be construed in a limiting sense since it is envisioned that not all of the projections and recesses of first PC substrate 4 need be complimentary to the recesses and projections in second PC substrate 6.

In some non-limiting embodiments or examples, at a suitable time, first PC substrate 4 and second PC substrate 6 can be moved in the directions of arrows D in FIG. 5D whereupon one or more projections PRO of second PC substrate 6 can be received in one or more recesses REC of first PC substrate 4 in an interdigitated manner and one or more projections PRO of first PC substrate 4 can be received one or more in recesses REC of second PC substrate 6 in an interdigitated manner in a manner similar to the projections and recesses of first and second substrates 4 and 6 shown in FIG. 3E.

Herein, interdigitated projections and recesses (i.e., projections received in recesses) may interlock, e.g., via friction fit, to join a pair of PC substrates. Also or alternatively, a suitable adhesive may be used to join and hold together pairs of PC substrates having interdigitated projections and recesses.

In some non-limiting embodiments or examples, as can be understood from FIGS. 5A and 5B, portions of one or more TCs on layers 50A and 50B of first and second PC substrates 4 and 6 may be in electrical contact with one or more BCs on layers 52A and 52B of first and second PC substrates 4 and 6 when PC substrates 4 and 6 are layered together as shown in FIG. 5C. In an example, at least a portion of the BC of layer 50B may make contact with at least a portion of the TC of layer 52A and at least a portion of the BC of layer 50A may make contact with at least a portion of the TC of layer 52B when first and second PC substrates 4 and 6 are mated together as shown in FIG. 5E. However, this is not to be construed in a limit sense.

In some non-limiting embodiments or examples, in the examples discussed above, at least some of the projections included traces of conductive material formed thereon. In these examples, the body of each projection was formed from the same material as the underlying PC substrate. However, this is not to be construed in a limiting sense since it is envisioned, as discussed hereinafter, that some or all projections of a PC substrate can be formed entirely of conductive material. In some non-limiting embodiments or examples, projections formed entirely of conductive material may be made in a manner described, for example, in U.S. Pat. No. 7,612,443, the contents of which are incorporated by reference.

The multi-layer PC substrates shown in FIGS. 5A-5E can have one or more of the same advantages discussed above for the PC substrates shown in FIGS. 1A-1C.

In some non-limiting embodiment or examples, each projection made entirely of conductive material can be in the form of a cantilever beam having a proximal end 68 supported by the PC substrate and a free, distal end 70. The largest dimension of this projection formed as a cantilever beam can be the distance between the proximal end 68 and the distal end 70. In another example, one or more projections can comprise conductive material formed on the facet or edge surface of an edge of at least a portion of the edge of a PC substrate as a contact pad having a largest dimension of the conductive material in a direction parallel to the facet or edge surface. The difference between a projection formed as a cantilever beam and a projection formed as a contact that will be discussed in greater detail hereinafter.

With reference to FIGS. 6A and 6B, in some non-limiting embodiments or examples, first PC substrate 4 and second PC substrate 6 can include projections 30 and 32 of conductive material formed as cantilevered beams. In an example, PC substrate 4 can include one or more projections 30 in the form of cantilever beams and PC substrate 6 can include one or more projections 32 in the form of cantilever beams. In this example, PC substrate 2 can be a microchip formed from a semiconductor material and PC substrate 6 can be a printed circuit board or printed wiring board. PC substrates 4 and 6 can be received on an optional carrier substrate 8 which can support first and second PC substrates 4 and 6 in operative relation with their respective projections 30 and 32 in the form of cantilever beams in electrical contact, whereupon power and/or electrical signals can be transferred from PC substrate 4 to PC substrate 6, or vice versa. In some non-limiting embodiments or examples, projections 30 and 32 in the form of cantilever beams in electrical contact may include distal ends of one or more pairs of projections 30 and 32 physically touching and/or may include conductive material, e.g., solder 84 or another conductive material, extending between, e.g., over the top surfaces, of one or more pairs of projections 30 and 32 having their distal ends physically touching or in spaced relation.

In some non-limiting embodiment or examples, the largest dimension of the projection 30, 32 formed as a cantilever beam can be a distance 72 (FIG. 6B) between the proximal end 68 and the distal end 70 of said projection.

The multi-layer PC substrates shown in FIGS. 6A-6B can have one or more of the same advantages discussed above for the PC substrates shown in FIGS. 1A-1C.

In some non-limiting embodiment or examples, as shown in FIGS. 7A and 7B, first and second PC substrates 4 and 6 can be positioned on an optional carrier substrate 8 with their respective projections 30 and 32 in the form of cantilever beams in electrical contact. In this manner, electrical power and/or electrical signals can be passed from first PC substrate 4 to second PC substrate 6, or vice versa. In this example (FIGS. 7A and 7B), first PC substrate 4 can be a first printed circuit board or a printed wiring board and second PC substrate 6 can be a second printed circuit board or printed wiring board. In some non-limiting embodiments or examples, projections 30 and 32 in the form of cantilever beams in electrical contact may include distal ends of one or more pairs of projections 30 and 32 physically touching and/or may include conductive material, e.g., solder 84 or another conductive material, extending between, e.g., over the top surfaces, of one or more pairs of projections 30 and 32 having their distal ends physically touching or in spaced relation.

The multi-layer PC substrates shown in FIGS. 7A-7B can have one or more of the same advantages discussed above for the PC substrates shown in FIGS. 1A-1C.

Figure 8B:
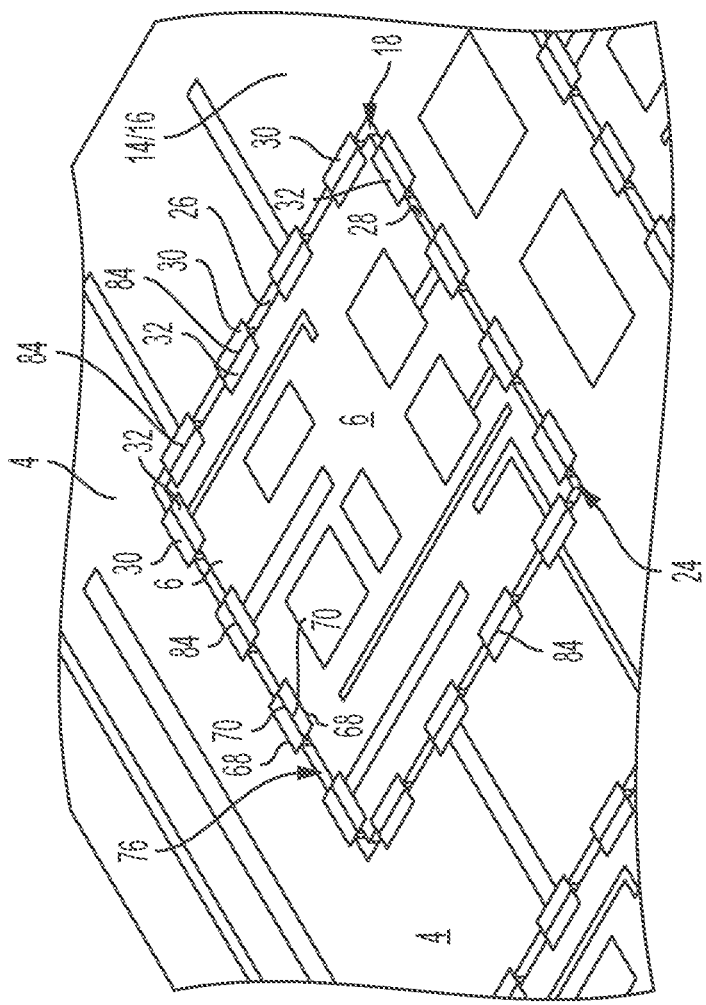
FIG. 8B is an isolated perspective view of the upper left portion of the substrate assembly shown in FIG. 8A, wherein the small PC substrate is received or inserted in the recess or pocket in the upper left portion of the large PC substrate and the projections of conductive material extending from one or more edges of the small PC substrate and one or more edges of the recess in which the small PC substrate electrically connect circuitry on the small PC substrate and the large PC substrate, in accordance with the principles of the present invention.
Figure 8A:
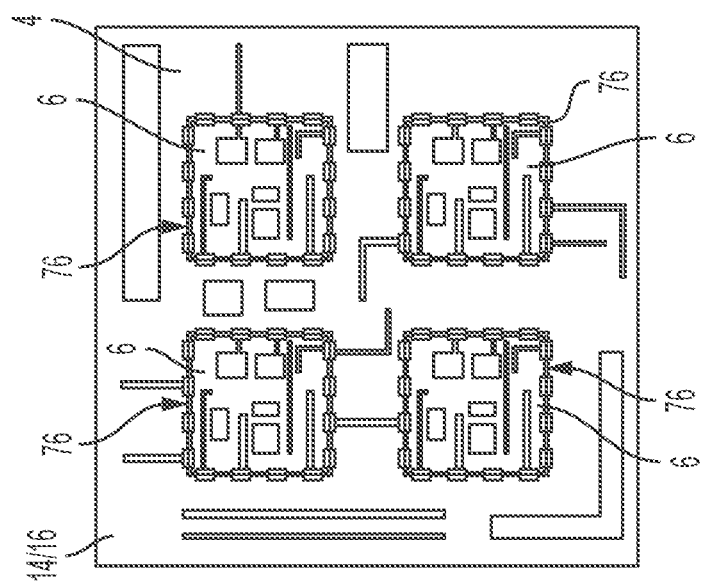
FIG. 8A is a top-down, plan view of one non-limiting embodiment or example substrate assembly including a large PC substrate including, in a top surface thereof, a plurality of recess or pockets, with a small PC substrate received or inserted in each recess or pocket, wherein projections of conductive material extending from one or more edges of each small PC substrate and one or more edges of the recess in which the small PC substrate is received electrically connect circuitry on the small PC substrate and the large PC substrate, in accordance with the principles of the present invention.

With reference to FIGS. 8A-8B, in some non-limiting embodiment or examples, first PC substrate 4 can include at least one recess 76 in the PC top surface 14 or PC bottom surface 16, thereof. In this example, second PC substrate 6 can be configured to be received within the recess 76.

In some non-limiting embodiments or examples, the first PC substrate 4 can include one or more projections 30, each made entirely of conductive material formed as a cantilever beam having a proximal end 68 supported by the PC substrate 4 and a free, distal end 72 that extends into a recess 76 from the facet or edge surface 26 of the edge 18 of first PC substrate that defines recess 76. In some non-limiting embodiment or examples, second PC substrate 6 can also include one or more projections 32 formed entirely of conductive material and having a proximal end 68 supported by second PC substrate 6 and a free, distal end 72 that extends away from the facet or edge surface 28 of the edge 24 of second PC substrate 6 as shown in FIG. 8B.

In some non-limiting embodiments or examples, recess 76 and second PC substrate 6 including projections 30 and 32 in the form of cantilever beams can be configured such that second PC substrate 6 may be inserted and mounted into recess 76 of first PC substrate 4 with the distal ends 70 of facing projections 30 and 32 in electrical contact. In some non-limiting embodiments or examples, facing projections 30 and 32 in the form of cantilever beams in electrical contact may include distal ends of one or more pairs of projections 30 and 32 physically touching and/or may include conductive material, e.g., solder 84 or another conductive material, extending between, e.g., over the top surfaces, of one or more pairs of projections 30 and 32 having their distal ends physically touching or in spaced relation. In this example, first PC substrate 4 can be a printed circuit board or printed wiring board and second PC substrate 2 can be a printed circuit board, a printed wiring board, or a microchip formed from a semiconductor material.

The multi-layer PC substrates shown in FIGS. 8A-8B can have one or more of the same advantages discussed above for the PC substrates shown in FIGS. 1A-1C.

With reference to FIGS. 9A-9E, in some non-limiting embodiment or examples, second PC substrate 6 can include a recess 76 in the PC top surface 14 or PC bottom surface 16, thereof. In this example, recess 76 can be configured to receive a number of first PC substrates 4 which can be electrically connected together via projections 30 on facet or edge surfaces of one or more edges of proximate first PC substrates 4.

In some non-limiting embodiment or examples, one or more projection 30 of each first PC substrate 4 can each comprise conductive material formed on the facet or edge surface 26 of at least a portion of the edge 18 of said first PC substrate as a contact pad. In this example, the largest dimension of the conductive material formed as a contact pad on the facet or edge surface is in a direction parallel to the facet or edge surface. Similarly, each projection 32 of second PC substrate 6 can comprise conductive material formed as a contact pad on the facet or edge surface 28 of the edge 24 defining the periphery of recess 76 as shown best in FIGS. 9A-9B.

In some non-limiting embodiment or examples, the plurality of first PC substrates 4 can be joined together with projections 30 of adjacent or proximate first PC substrates in electrical contact to form the assembled array of first PC substrates 4 shown in FIG. 9B. In some non-limiting embodiments or examples, projections 30 of adjacent or proximate first PC substrates may be physically touching and/or may include conductive material, e.g., solder 84 or another conductive material, extending between, e.g., over the top surfaces, of one or more pairs of projections 30 physically touching or in spaced relation.

Figure 9D:
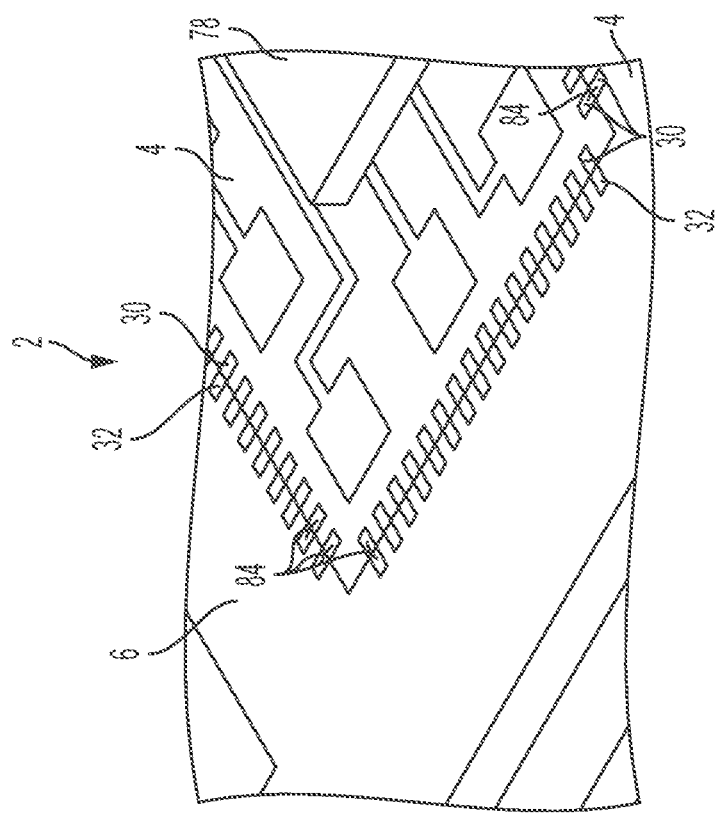
FIG. 9D is an isolated perspective view of the assembled perspective view of the substrate assembly shown in FIG. 9C showing edge projections of one small PC substrate connected to edge projection of the recess or pocket of the large PC substrate and other PC substrate coupled to contacts on the top surface of at least a portion of the one small PC substrate, in accordance with the principles of the present invention.
Figure 9C:
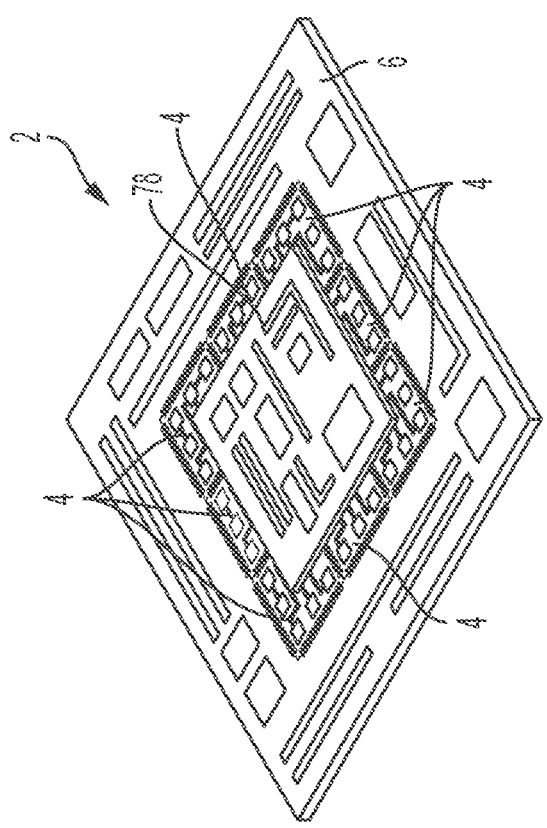
FIG. 9C is an assembled perspective view of the substrate assembly of FIGS. 9A-9B wherein the assembled small PC substrates are positioned or received in the recess or pocket of the large PC and the other PC substrate is coupled to contacts on top surfaces of the at least a portion of the small PC substrates, in accordance with the principles of the present invention.

As shown in FIG. 9C, in the final assembly of first and second PC substrates 4 and 6 shown in FIG. 9B, the assembled array of the first PC substrates 4 can be received in receiving slot 76 with projections 30 in the form of contact pads around the periphery of the assembled array of the first PC substrates 4 shown in FIG. 9B in electrical contact with the projections 32 in the form of contact pads on the periphery or edge(s) of recess 76. In some non-limiting embodiments or examples, one or more pairs of projections 30 and 32 may be physically touching and/or may include conductive material, e.g., solder 84 (or another conductive material), extending between, e.g., over the top surfaces, of one or more pairs of projections 30 and 32 having their distal ends physically touching or in spaced relation.

In an example, the particular order of assembling the array of first PC substrate 4 shown in FIG. 9B into recess 76 is not to be construed in a limiting sense. For example, each individual substrate 4 may be included in recess 76 one at a time. Alternatively, two or more or all of first PC substrates 4 can be coupled together into the assembled array of the first PC substrates 4 outside of recess 76, which assembled array of the first PC substrates 4 can then be then inserted into recess 76 with distal ends of adjacent contact pads 30 and 32 in electrical contact. At a suitable time, a third PC substrate 78 may be mounted on top of one or more or all of the first PC substrates 4 forming assembled array of the first PC substrates 4, e.g., via bump bonding, received in or to be received in receiving slot 76.

FIG. 9D is a close up view of one PC substrate 4 having projections 30 on two sides thereof in electrical contact (e.g., physically touching and/or via a conductive material 84) with projections 32 of PC substrate 6 on two sides of recess 76. FIG. 9D also shows two projections 30 of adjacent or proximate first PC substrate 4 in electrical contact.

Figure 9E:
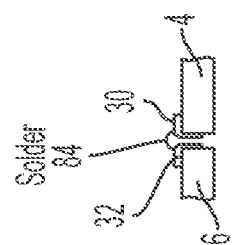
FIG. 9E is an isolated side view of one edge projection of the one small PC substrate connected to one edge projection of the recess or pocket of the large PC substrate shown in FIG. 9D, in accordance with the principles of the present invention.

Finally, FIG. 9E shows a side view of one projection 30 in the form of a contact pad of first PC substrate 4 in electrical contact with a projection 32 in the form of a contact pad of second PC substrate 6. In some non-limiting embodiments or examples, the electrical contact between one or more pairs of projections 30 and 32 may be via physical contact between projections 30 and 32 and/or via a solder 84 (or another conductive material) extending between, e.g., over the top surfaces, of projections 30 and 32 which may be in contact or which may be in spaced relation.

The multi-layer PC substrates shown in FIGS. 9A-9E can have one or more of the same advantages discussed above for the PC substrates shown in FIGS. 1A-1C.

As can be seen disclosed herein is a substrate assembly 2 comprising: at least one printed circuit (PC) substrate 4, 6, wherein: each PC substrate 4, 6 includes a PC top surface 14 and a PC bottom surface 16 spaced from each other and an edge 18 that runs at least partially about a periphery of the PC substrate 4, 6 between the PC top surface 14 and the PC bottom surface 16. The edge 18 includes or defines on a facet or edge surface 26, 28 of said edge 18 at least one projection 30, 32 that extends transverse or normal to said facet or edge surface 26, 28. The projection 30, 32 includes a projection top surface 34, 38 and a projection bottom surface 36, 40 spaced from each other. The projection 30, 32 comprises conductive material.

In some non-limiting embodiments or examples, the conductive material can include a conductor (or conductive trace 42, 44 formed on at least one of the projection top surface and the projection bottom surface. In some non-limiting embodiments or examples, the projection can be formed of the conductive material.

In some non-limiting embodiments or examples, the projection top surface and the projection bottom surface can be coincident, coextensive, or reside in the same plane as the respective PC top surface 14 and the PC bottom surface 16.

In some non-limiting embodiments or examples, one of the projection top surface 34 and the projection bottom surface 36 can be coincident, coextensive, or reside in the same plane as the respective PC top surface 14 and the PC bottom surface 16 and the other of the projection top surface 34 and the projection bottom surface 36 can extend transverse or normal away from the facet or edge surface 26, 28 from a location between PC top surface 14 and the PC bottom surface 16.

In some non-limiting embodiments or examples, the at least one PC substrate can include a first PC substrate 4 and a second PC substrate 6. The projection 30 of the first PC substrate 4 can include its projection bottom surface 36 coincident, coextensive, or residing in the same plane as its PC bottom 16 surface and its projection top surface 34 extending transverse from the facet or edge surface 26 of the edge 18 of the first PC substrate 4 from a location between the PC top surface 14 and the PC bottom surface 16 of the first PC substrate 4. The projection 32 of the second PC substrate 6 can include its projection top surface 38 coincident, coextensive, or residing in the same plane as its PC top surface 20 and its projection bottom surface 40 extending transverse from the facet or edge surface 28 of the edge 24 of the second PC substrate 6 from a location between the PC top surface 20 and PC bottom surface 24 of the second PC substrate 6. The projection bottom surface 40 of the second PC substrate 6 can overlap and be in contact with the projection top surface 34 of the first PC substrate 14.

In some non-limiting embodiments or examples, the projection 30 of the first PC substrate 4 can include its conductive material 42 on its projection top surface 34. The projection 32 of the second PC substrate 6 can include its conductive material 44 on its projection bottom surface 40 which makes electrical contact with the conductive material 42 on the projection top surface 34 of the projection 30 of the first PC substrate 4 when the projection bottom surface 40 of the second PC substrate 6 overlaps and is in contact with the projection top surface 34 of the second PC substrate 4.

In some non-limiting embodiments or examples, the at least one projection 30, 32 can include at least one pair of projections 30, 32 having a recess 46, 48 therebetween.

In some non-limiting embodiments or examples, each projection 30, 32 can include the projection top surface 34, 38 and the projection bottom surface 36, 40 coincident, coextensive, or residing in the same planes as the respective PC top surface 14, 20 and the PC bottom surface 16, 22.

In some non-limiting embodiments or examples, the at least one pair of projections 30, 32 can include: a first pair of spaced projections 30 in a first plane of 14 the PC substrate 4 having a first recess 46 therebetween and a second pair of spaced projections 32 in a second, parallel or substantially plane 22 of the PC substrate 4 having a second recess 48 therebetween. At least one of the first pair of projections 30 can be aligned, in a direction normal or substantially normal to the first and second planes 14, 22, with the second recess 48, and at least one of the second pair of projections 32 can be aligned, in a direction normal or substantially normal to the first and second planes 14, 22, with the first recess 46.

In some non-limiting embodiments or examples, the at least one PC substrate can include first and second PC substrates 4 and 6, each including the first and second pairs of transversely extending, spaced projections 30 and 32. The first and second PC substrates 4 and 6 can be positioned, arranged, or configured with the first and second pairs of transversely extending, spaced projections 30 of the first PC substrate 4 and the first and second pairs of transversely extending, spaced projections 32 of the second PC substrate 6 interdigitated with each other.

In some non-limiting embodiments or examples, the PC substrate can be comprised of two or more layers.

In some non-limiting embodiments or examples, the at least one PC substrate can include first and second PC substrates 4 and 6, each including the projection 30 and 32 made of the conductive material formed as a cantilevered beam having a proximal end 68 supported by the PC substrate 30, 32 and a free, distal end 70, wherein a largest dimension of the conductive material formed as the cantilevered beam is a distance 72 between the proximal end 68 and the distal end 70. The first and second PC substrates 4, 6 can be positioned, arranged, or configured adjacent or proximate each other with the free, distal ends 70 of their respective projections 30 and 32 in electrical contact, wherein one of the first and second PC substrates 4, 6 is a microchip or a rigid or flexible printed circuit board or printed wiring board and the other of the first and second PC substrates 4, 6 is a rigid or flexible printed circuit board or printed wiring board.

In some non-limiting embodiments or examples, the microchip can be formed from a semiconductor material and each printed circuit board or printed wiring board can be made from any suitable and/or desirable material, such as, for example a glass-reinforced epoxy laminate, polyamide, polytetrafluoroethylene (PTFE), etc.

In some non-limiting embodiments or examples, the at least one PC substrate includes first and second PC substrates 4 and 6, each including the projection 30 and 32 of the conductive material and having a proximal end 68 supported by the PC substrate and a free, distal end 70. The second PC substrate 6 can be received in a recess 76 in the PC top surface 14 or the PC bottom surface 16 of the first PC substrate 4 with their respective projections 30 and 32 in electrical contact.

In some non-limiting embodiments or examples, each projection 30, 32 of the conductive material can be formed as a cantilevered beam having the proximal end 68 supported by its PC substrate 4, 6 and the free, distal end 70, wherein a largest dimension of the conductive material formed as the cantilevered beam is a distance between the proximal end 68 and the distal end 70.

In some non-limiting embodiments or examples, each of the first and second PC substrates 4 and 6 can be a printed circuit board or printed wiring board. In some non-limiting embodiments or examples, each printed circuit board or printed wiring board can be made from at least one of the following: a glass-reinforced epoxy laminate, a polyamide, or PTFE.

In some non-limiting embodiments or examples, each projection 30, 32 can comprise the conductive material formed on the facet or edge surface 26, 28 as a contact pad, wherein a largest dimension of the conductive material formed as the contact pad on the facet or edge surface 26, 28 is in a direction parallel to the facet or edge surface 26, 28.

In some non-limiting embodiments or examples, the at least one PC substrate 4, 6 can include plural second PC substrates 6 received in the recess 76 in the PC top surface 14 or the PC bottom surface 16 of the first PC substrate 4 with the projections 30, 32 of adjacent or proximate second PC substrates 6 are in electrical contact.

Herein, each instance of "conductive material" may include, without limitation, copper, aluminum, gold, or any other suitable and/or desirable conductive material, element, or compound.

Although the invention has been described in detail for the purpose of illustration based on what is currently considered to be the most practical preferred and non-limiting embodiments, examples, or aspects, it is to be understood that such detail is solely for that purpose and that the invention is not limited to the disclosed preferred and non-limiting embodiments, examples, or aspects, but, on the contrary, is intended to cover modifications and equivalent arrangements that are within the spirit and scope of the appended claims. For example, it is to be understood that the present invention contemplates that, to the extent possible, one or more features of any preferred and non-limiting embodiment, example, or aspect can be combined with one or more features of any other preferred and non-limiting embodiment, example, or aspect.

The invention claimed is:
1. A substrate assembly comprising:
at least one printed circuit (PC) substrate, wherein:
each PC substrate includes a PC top surface and a PC bottom surface spaced from each other and an edge that runs at least partially about a periphery of the PC substrate between the PC top surface and the PC bottom surface;
the edge including or defining on a facet or edge surface of said edge at least one projection that extends transverse or normal to said facet or edge surface;
the projection including a projection top surface and a projection bottom surface spaced from each other; and
the projection comprises conductive material, wherein the at least one PC substrate includes a first PC substrate and a second PC substrate;
the projection of the first PC substrate includes its projection top surface coincident, coextensive, or residing in the same plane as its PC top surface and its projection bottom surface extending transverse from the facet or edge surface of the edge of the first PC substrate from a location between the PC top surface and the PC bottom surface of the first PC substrate;
the projection of the second PC substrate includes its projection bottom surface coincident, coextensive, or residing in the same plane as its PC bottom surface and its projection top surface extending transverse from the facet or edge surface of the edge of the second PC substrate from a location between the PC top surface and the PC bottom surface of the second PC substrate; and the projection bottom surface of the first PC substrate overlaps and is in contact with the projection top surface of the second PC substrate.

2. The substrate assembly of claim 1, wherein the conductive material includes a conductor formed on at least one of the projection top surface and the projection bottom surface.

3. The substrate assembly of claim 1, wherein the projection is formed partially or entirely of the conductive material.

4. The substrate assembly of claim 1, wherein:
the projection of the first PC substrate includes its conductive material on its projection bottom surface; and
the projection of the second PC substrate includes its conductive material on its projection top surface which makes electrical contact with the conductive material on the projection bottom surface of the projection of the first PC substrate when the projection bottom surface of the first PC substrate overlaps and is in contact with the projection top surface of the second PC substrate.

5. The substrate assembly of claim 1, wherein the PC substrate is comprised of at least two layers.

6. A substrate assembly comprising:
at least one printed circuit (PC) substrate, wherein:
each PC substrate includes a PC top surface and a PC bottom surface spaced from each other and an edge that runs at least partially about a periphery of the PC substrate between the PC top surface and the PC bottom surface;
the edge including or defining on a facet or edge surface of said edge at least one projection that extends transverse or normal to said facet or edge surface;
the projection including a projection top surface and a projection bottom surface spaced from each other; and
the projection comprises conductive material, wherein the projection includes at least one pair of projections having a recess therebetween, wherein each projection includes the projection top surface and the projection bottom surface coincident, coextensive, or residing in the same planes as the respective PC top surface and the PC bottom surface.

7. A substrate assembly comprising:
at least one printed circuit (PC) substrate, wherein:
each PC substrate includes a PC top surface and a PC bottom surface spaced from each other and an edge that runs at least partially about a periphery of the PC substrate between the PC top surface and the PC bottom surface;
the edge including or defining on a facet or edge surface of said edge at least one projection that extends transverse or normal to said facet or edge surface;
the projection including a projection top surface and a projection bottom surface spaced from each other; and
the projection comprises conductive material, wherein the projection includes at least one pair of projections having a recess therebetween, wherein the at least one pair of projections includes:
a first pair of spaced projections in a first plane of the PC substrate having a first recess therebetween; and
a second pair of spaced projections in a second, parallel plane of the PC substrate having a second recess therebetween, wherein at least one of the first pair of projections is aligned, in a direction normal to the first and second planes, with the second recess, and at least one of the second pair of projections is aligned, in a direction normal to the first and second planes, with the first recess.

8. The substrate assembly of claim 7, wherein:
the at least one PC substrate includes first and second PC substrates, each including the first and second pairs of spaced projections; and
the first and second PC substrates are positioned, arranged, or configured with the first and second pairs of spaced projections of the first PC substrate and the first and second pairs of spaced projections of the second PC substrate interdigitated with each other.

9. A substrate assembly comprising:
at least one printed circuit (PC) substrate, wherein:
each PC substrate includes a PC top surface and a PC bottom surface spaced from each other and an edge that runs at least partially about a periphery of the PC substrate between the PC top surface and the PC bottom surface;
the edge including or defining on a facet or edge surface of said edge at least one projection that extends transverse or normal to said facet or edge surface;
the projection including a projection top surface and a projection bottom surface spaced from each other;
the projection comprises conductive material, wherein the projection is formed partially or entirely of the conductive material,
the at least one PC substrate includes first and second PC substrates, each including the projection made of the conductive material formed as a cantilevered beam having a proximal end supported by the PC substrate and a free, distal end, wherein a largest dimension of the conductive material formed as the cantilevered beam is a distance between the proximal end and the distal end; and
the first and second PC substrates are positioned, arranged, or configured adjacent or proximate each other with their respective projections in electrical contact, wherein one of the first and second PC substrates is a microchip or a rigid or flexible printed circuit board or printed wiring board and the other of the first and second PC substrates is a rigid or flexible printed circuit board or printed wiring board.

10. The substrate assembly of claim 9, wherein:
the microchip is formed from a semiconductor material; and
each printed circuit board or printed wiring board is made from at least one of the following: a glass-reinforced epoxy laminate or a polyamide.

11. A substrate assembly comprising:
at least one printed circuit (PC) substrate, wherein:
each PC substrate includes a PC top surface and a PC bottom surface spaced from each other and an edge that runs at least partially about a periphery of the PC substrate between the PC top surface and the PC bottom surface;
the edge including or defining on a facet or edge surface of said edge at least one projection that extends transverse or normal to said facet or edge surface;
the projection including a projection top surface and a projection bottom surface spaced from each other;
the projection comprises conductive material, wherein the projection is formed partially or entirely of the conductive material,
the at least one PC substrate includes first and second PC substrates, each including the projection of the conductive material and having a proximal end supported by the PC substrate and a free, distal end; and the second PC substrate is received in a recess in the PC top surface or the PC bottom surface of the first PC substrate with their respective projections in electrical contact, wherein each projection of the conductive material is formed as a cantilevered beam having the proximal end supported by its PC substrate and the free, distal end, wherein a largest dimension of the conductive material formed as the cantilevered beam is a distance between the proximal end and the distal end.

12. The substrate assembly of claim 11, wherein each of the first and second PC substrates is a printed circuit board or printed wiring board.

13. The substrate assembly of claim 12, wherein each printed circuit board or printed wiring board is made from at least one of the following: a glass-reinforced epoxy laminate, a polyamide, or PTFE.

14. A substrate assembly comprising:

at least one printed circuit (PC) substrate, wherein:

each PC substrate includes a PC top surface and a PC bottom surface spaced from each other and an edge that runs at least partially about a periphery of the PC substrate between the PC top surface and the PC bottom surface;

the edge including or defining on a facet or edge surface of said edge at least one projection that extends transverse or normal to said facet or edge surface;

the projection including a projection top surface and a projection bottom surface spaced from each other;

the projection comprises conductive material, wherein the projection is formed partially or entirely of the conductive material, the at least one PC substrate includes first and second PC substrates, each including the projection of the conductive material and having a proximal end supported by the PC substrate and a free, distal end; and the second PC substrate is received in a recess in the PC top surface or the PC bottom surface of the first PC substrate with their respective projections in electrical contact, wherein each projection comprises the conductive material formed on the facet or edge surface as a contact pad, wherein a largest dimension of the conductive material formed as the contact pad on the facet or edge surface is in a direction parallel to the facet or edge surface.

15. The substrate assembly of claim 14, wherein:

the at least one PC substrate includes plural second PC substrates received in the recess in the PC top surface or the PC bottom surface of the first PC substrate; and the projections of adjacent or proximate second PC substrates are in electrical contact.

\* \* \* \* \*

UNITED STATES PATENT AND TRADEMARK OFFICE
CERTIFICATE OF CORRECTION

| | | |
|---|---|---|
| PATENT NO. | : 11,224,126 B2 | Page 1 of 1 |
| APPLICATION NO. | : 16/757880 | |
| DATED | : January 11, 2022 | |
| INVENTOR(S) | : Kulick et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 60 days.

Signed and Sealed this
Sixth Day of December, 2022

Katherine Kelly Vidal
*Director of the United States Patent and Trademark Office*